(12) United States Patent
Yang et al.

(10) Patent No.: US 12,342,539 B2
(45) Date of Patent: Jun. 24, 2025

(54) PROTECTIVE LINER LAYERS IN 3D MEMORY STRUCTURE

(71) Applicant: Taiwan Semiconductor Manufacturing Company, Ltd., Hsinchu (TW)

(72) Inventors: Tsu Ching Yang, Taipei (TW); Sheng-Chih Lai, Hsinchu (TW); Yu-Wei Jiang, Hsinchu (TW); Kuo-Chang Chiang, Hsinchu (TW); Hung-Chang Sun, Kaohsiung (TW); Chen-Jun Wu, Hsinchu (TW); Feng-Cheng Yang, Zhudong Township (TW); Chung-Te Lin, Tainan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 82 days.

(21) Appl. No.: 18/336,252

(22) Filed: Jun. 16, 2023

(65) Prior Publication Data

US 2023/0328980 A1    Oct. 12, 2023

Related U.S. Application Data

(62) Division of application No. 17/190,735, filed on Mar. 3, 2021, now Pat. No. 11,723,199.

(51) Int. Cl.
*H10B 43/20* (2023.01)
*H10B 43/30* (2023.01)
(Continued)

(52) U.S. Cl.
CPC .............. *H10B 43/20* (2023.02); *H10B 43/30* (2023.02); *H10B 51/20* (2023.02); *H10B 51/30* (2023.02)

(58) Field of Classification Search
CPC ........ H10B 41/10; H10B 41/20; H10B 43/10; H10B 43/20; H10B 43/30; H10B 51/20; H10B 51/30
See application file for complete search history.

(56) References Cited

U.S. PATENT DOCUMENTS

2020/0185411 A1* 6/2020 Herner ............. H01L 21/32139
2021/0175253 A1   6/2021 Han et al.

OTHER PUBLICATIONS

Non-Final Office Action dated Dec. 16, 2022 for U.S. Appl. No. 17/190,735.

(Continued)

*Primary Examiner* — Meiya Li
(74) *Attorney, Agent, or Firm* — Eschweiler & Potashnik, LLC

(57) ABSTRACT

A memory device includes a stack of gate electrode layers and interconnect layers arranged over a substrate. A first memory cell that is arranged over the substrate includes a first source/drain conductive lines and a second source/drain conductive line extending vertically through the stack of gate electrode layers. A channel layer and a memory layer are arranged on outer sidewalls of the first and second source/drain conductive lines. A first barrier structure is arranged between the first and second source/drain conductive lines. A first protective liner layer separates the first barrier structure from each of the first and second source/drain conductive lines. A second barrier structure is arranged on an opposite side of the first source/drain conductive line and is spaced apart from the first source/drain conductive line by a second protective liner layer.

20 Claims, 24 Drawing Sheets

(51) Int. Cl.
*H10B 51/20* (2023.01)
*H10B 51/30* (2023.01)

(56) References Cited

OTHER PUBLICATIONS

Notice of Allowance dated Mar. 23, 2023 for U.S. Appl. No. 17/190,735.

* cited by examiner

PROTECTIVE LINER LAYERS IN 3D MEMORY STRUCTURE

REFERENCE TO RELATED APPLICATION

This application is a Divisional of U.S. application Ser. No. 17/190,735, filed on Mar. 3, 2021, the contents of which are hereby incorporated by reference in their entirety.

BACKGROUND

Two-dimensional (2D) memory arrays are prevalent in electronic devices and may include, for example, NOR flash memory arrays, NAND flash memory arrays, dynamic random-access memory (DRAM) arrays, and so on. However, 2D memory arrays are reaching scaling limits and are hence reaching limits on memory density. Three-dimensional (3D) memory arrays are a promising candidate for increasing memory density and may include, for example, 3D NAND flash memory arrays, 3D NOR flash memory arrays, and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
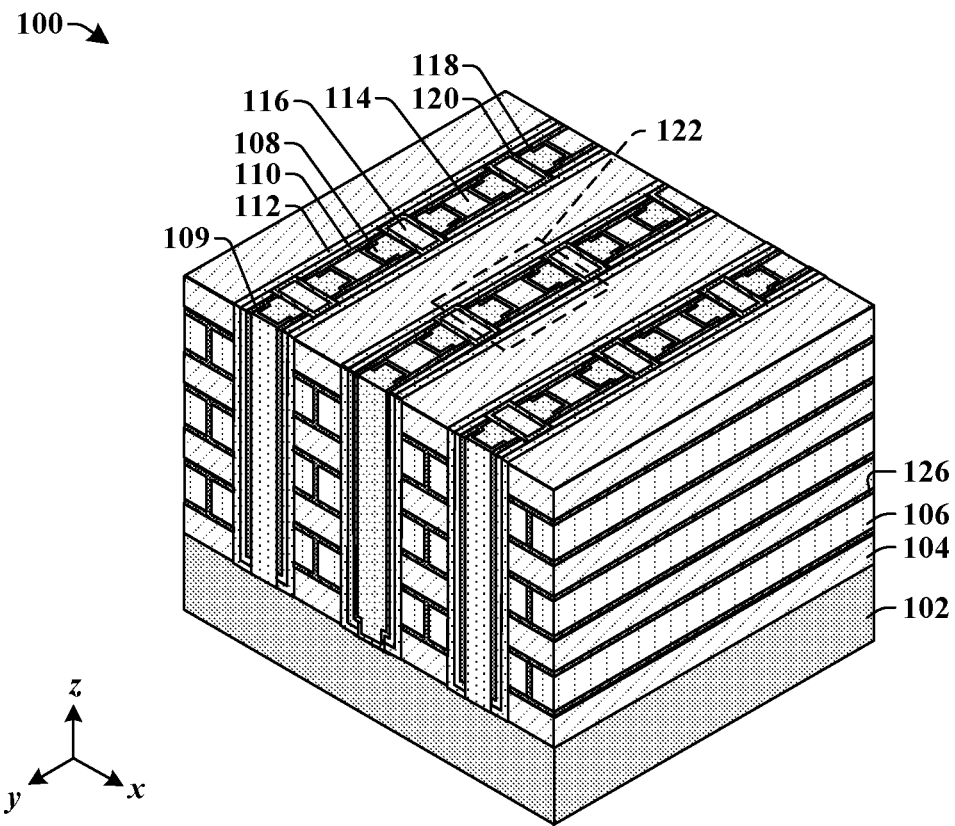
FIG. 1 illustrates a perspective view of some embodiments of an integrated chip comprising a 3D NOR type memory array having protective liner layers around barrier structures.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A three-dimensional (3D) NOR type memory array may comprise multiple horizontally stacked gate electrode layers arranged between a source conductive line and a drain conductive line that extend in the vertical direction. The 3D NOR type memory array comprises memory cells that are arranged at a high density over a substrate and are connected in parallel to achieve a sum-of-product operation. Each memory cell of the 3D NOR type memory array may be accessed by applying signals to the source conductive line, the drain conductive line, and the gate electrode layer through access circuitry. A channel layer may be arranged on outermost sidewalls of the source and drain conductive lines, and a memory layer may be arranged on outermost sidewalls of the channel layer and between the gate electrode layers and the source and drain conductive lines. First barrier structures may separate the source conductive line from the drain conductive line within a same memory cell, and second barrier structures may isolate memory cells from one another that share a same gate electrode. Data may be written to and read from the memory layer of each memory cell based on the current that flows through the channel layer while a memory cell is accessed.

A 3D NOR type memory array may be formed by forming a trench within a stack of gate electrode layers spaced apart from one another by interconnect dielectric layers. The memory layer, the channel layer, and dielectric layers may be deposited within the trench. In some embodiments, first barrier structures are formed within the trench of the stack of gate electrode layers and interconnect dielectric layers, and sacrificial structures are formed between the first barrier structures, wherein the sacrificial structures will be replaced with the source and drain conductive lines. Second barrier structures are formed between the sacrificial structures, and then, the sacrificial structures are removed and replaced by a conductive material to form the source and drain conductive lines. However, during removal of the sacrificial structures, portions of the first and second barrier structures may be removed, which reduces the size of the first and second barrier structures, thereby reducing electrical isolation within a memory cell and between memory cells.

Various embodiments of the present disclosure relate to forming a first protective liner layer around the first barrier structure and a second protective liner layer around the second barrier structure such that the sacrificial structures are continuously surrounded by the first and second protective liner layers. The first and second protective liner layers comprise materials that are substantially resistant to removal by the etchant(s) used to remove the sacrificial structures. Thus, in some such embodiments, when the sacrificial structures are removed, the first and second protective liners prevent removal of the first and second barrier structures.

Therefore, the first and second protective liners protect the first and second barrier structures to improve electrical isolation between the source and drain conductive lines within a same memory cell and to improve electrical isolation between memory cells to improve reliability of the overall 3D NOR type memory array.

FIG. 1 illustrates a perspective view 100 of some embodiments of a 3D NOR type memory array comprising a first protective liner layer around a first barrier structure and a second protective liner layer around a second barrier structure.

The 3D NOR type memory array in the perspective view 100 of FIG. 1 is illustrated on a xyz coordinate system. In some embodiments, the 3D NOR type memory array comprises interconnect dielectric layers 104 vertically stacked in alternating order with gate electrode layers 106. In some embodiments, source/drain conductive lines 108 extend vertically in the z-direction through the stack of interconnect dielectric layers 104 and gate electrode layers 106.

In some embodiments, the array includes memory cells 122 spaced apart from one another in the y-direction by second barrier structures 116, spaced apart from one another in the x-direction by the interconnect dielectric layers 104, and spaced apart in the z-direction by the interconnect dielectric layers 104. Each memory cell 122 comprises two of the source/drain conductive lines 108, a channel layer 110, the gate electrode layer 106, and a memory layer 112. In some embodiments, the channel layer 110 continuously extends along outermost sidewalls of the source/drain conductive lines 108. In some embodiments, the memory layer 112 extends along outermost sidewalls of the channel layer 110. In some embodiments, the source/drain conductive lines 108 are spaced apart from one another in the y-direction by a first barrier structure 114. In some embodiments, each memory cell 122 further includes a dielectric layer 109 extending between the source/drain conductive lines 108 and along outer sidewalls of the first barrier structure 114.

In some embodiments, each memory cell 122 is accessed for memory to be written to or read from the memory layer 112 by access circuitry. The memory cell 122 is accessed when a suitable signal (e.g., current, voltage) is applied to the source/drain conductive lines 108 and gate electrode layer 106 to turn "ON" and cause mobile charge carriers to flow through the channel layer 110. In some embodiments, the memory layer 112 comprises material that can store data upon different biases flowing across the channel layer 110 such as, for example, a silicon dioxide-silicon nitride-silicon dioxide (ONO) structure, a ferroelectric material (e.g., hafnium oxide, hafnium zinc oxide, etc.), or some other suitable memory storage material. In some embodiments, a gate dielectric layer 126 may be arranged between the interconnect dielectric layers 104 and the gate electrode layers 106. In some embodiments, the gate dielectric layer 126 may also be arranged between portions of the gate electrode layers 106 in the x-direction and arranged between the gate electrode layers 106 and the interconnect dielectric layers 104 in the y-direction.

In some embodiments, a first protective liner layer 118 is arranged on outermost sidewalls of the source/drain conductive lines 108 and arranged on surfaces of the first barrier structures 114. For example, in some embodiments, the first protective liner layer 118 is arranged directly between the source/drain conductive lines 108 and the first barrier structure 114, directly between the source/drain conductive lines 108 and the dielectric layer 109, and directly between the source/drain conductive lines 108 and the channel layer 110. In some embodiments, the first protective liner layer 118 comprises a different material than the first barrier structure 114. For example, in some embodiments, the first barrier structure 114 may comprise a dielectric material such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the first protective liner layer 118 may comprise, for example, a metal (e.g., titanium, titanium nitride), a metal oxide (e.g., aluminum oxide, hafnium oxide, titanium oxide), or some other material that is different than the first barrier structure 114.

In some embodiments, a second protective liner layer 120 is arranged on and continuously surrounds each second barrier structure 116. Thus, in some embodiments, the second protective liner layer 120 is arranged directly between the source/drain conductive lines 108 and the second barrier structures 116. In some embodiments, the second protective liner layer 120 also separates channel layers 110 between each memory cell 122. In some embodiments, the second protective liner layer 120 comprises a different material than the second barrier structure 116. For example, in some embodiments, the second protective liner layer 120 comprises a dielectric material such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the second protective liner layer 120 may comprise silicon dioxide, aluminum oxide, or some other material that is different than the second barrier structure 116.

In some embodiments, the source/drain conductive lines 108 are formed by removing and replacing sacrificial structures with the source/drain conductive lines 108. In some such embodiments, the first and second protective liner layers 118, 120 have a slower rate of removal than the first and second barrier structures 114, 116 when exposed to an etchant or etchants used to remove the sacrificial structures. Therefore, the first protective liner layer 118 and the second protective liner layer 120 protect the first barrier structure 114 and the second barrier structure 116, respectively, from removal by the etchant(s) used to remove the sacrificial structures such that the first and second barrier structures 114, 116 may provide sufficient electrical isolation within and between memory cells 122.

Figure 2:
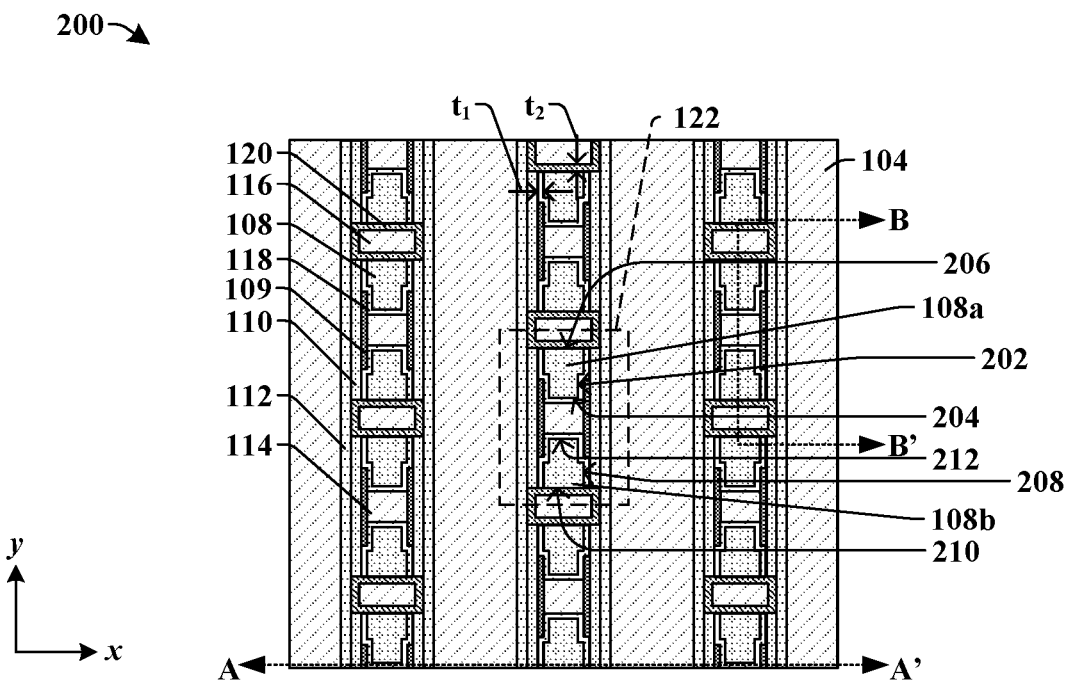
FIG. 2 illustrates a top-view of some embodiments of the integrated chip of FIG. 1.

FIG. 2 illustrates a top-view 200 of some embodiments corresponding to the perspective view 100 of FIG. 1. The top-view 200 of FIG. 2 is on an xy-plane.

In some embodiments, the first protective liner layer 118 has a first thickness $t_1$ in a range of between, for example, approximately 1 nanometer and approximately 100 nanometers, and the second protective liner layer 120 has a second thickness $t_2$ in a range of between, for example, approximately 1 nanometer and approximately 100 nanometers.

Further, in some embodiments, the first protective liner layer 118 may comprise a metal (e.g., titanium, titanium nitride, etc.) to help reduce resistance between the source/drain conductive lines 108 and the channel layer 110. In some other embodiments, the first protective liner layer 118 may comprise a metal oxide (e.g., aluminum oxide, hafnium oxide, titanium oxide, etc.) to mitigate damage to the channel layer 110 during the formation to the first protective liner layer 118. In yet some other embodiments, the first protective liner layer 118 may comprise a semiconductor material such as, for example, indium gallium zinc oxide, to help control the mobility, on/off current, and threshold voltage of the memory cell 122. In some such other embodiments, if the first protective liner layer 118 comprises semiconductor material, the first protective liner layer 118 comprises a different composition, dopant concentration, structure, or some other characteristic than the channel layer 110, which may also comprise a semiconductor material. In some embodiments, the second protective liner layer 120 comprises a dielectric material such as, for example, silicon dioxide, aluminum oxide, or some other suitable low-k dielectric material, to reduce signal delays when the memory cell 122 is accessed.

In some embodiments, a first portion of the first protective liner layer 118 may be described as covering outer sidewalls 202 of a first source/drain conductive line 108a and a lower surface 204 of the first source/drain conductive line 108a. In some embodiments, a second portion of the first protective liner layer 118 may be described as covering outer sidewalls 208 of a second source/drain conductive line 108b and an upper surface 212 of the second source/drain conductive line 108b. In some embodiments, a first one of the second protective liner layers 120 in a memory cell 122 is arranged on an upper surface 206 of the first source/drain conductive line 108a, and a second one of the second protective liner layers 120 in the memory cell 122 is arranged on a lower surface 210 of the second source/drain conductive line 108b. In some such embodiments, the upper and lower surfaces 206, 204 of the first source/drain conductive line 108a and the upper and lower surfaces 212, 210 of the second source/drain conductive line 108b are normal to the y-direction. Further, the outer sidewalls 202 of the first source/drain conductive line 108a connect the upper surface 206 to the lower surface 204 of the first source/drain conductive line 108a, and the outer sidewalls 208 of the second source/drain conductive line 108b connect the upper surface 212 to the lower surface 210 of the second source/drain conductive line 108b.

In some embodiments, the second barrier structures 116 and the second protective liner layer 120 completely separate the channel layers 110 between each memory cell 122 in the y-direction. Contrarily, in some embodiments, memory layers 112 continuously extend in the y-direction and are shared amongst the memory cells 122. In some other embodiments, the second barrier structures 116 and the second protective liner layer 120 may also completely separate the memory layers 112 between each memory cell 122 in the y-direction.

Figure 3:
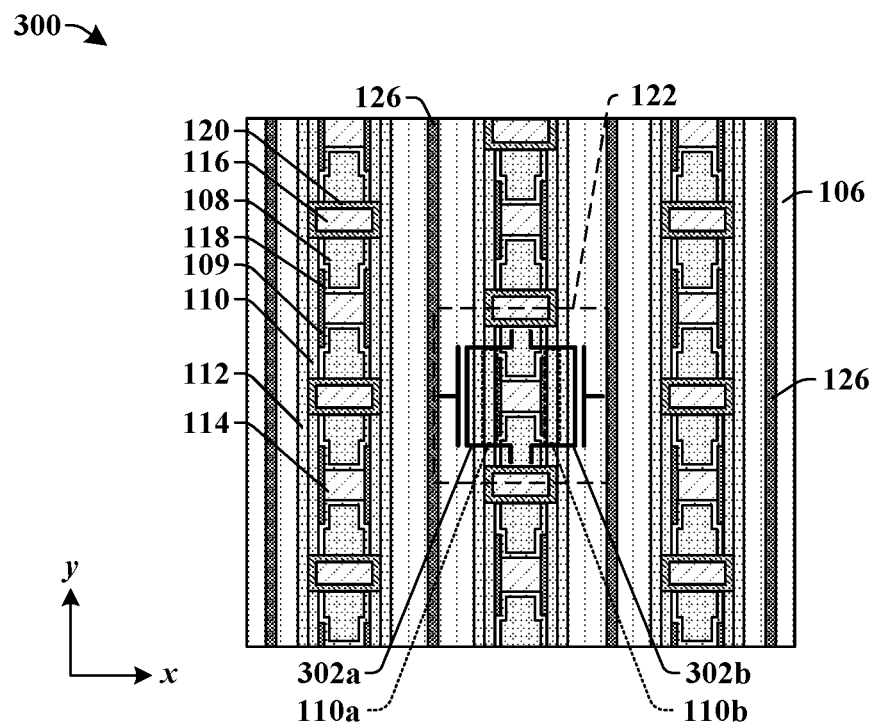
FIG. 3 illustrates a top-view corresponding to the top-view of FIG. 1 and including transistor diagrams overlaying the 3D NOR type memory array.

FIG. 3 illustrates a top-view 300 of some other embodiments corresponding to the perspective view 100 of FIG. 1 and also including transistor diagrams to illustrate how the memory cells of the 3D NOR type memory array operate.

In some embodiments, a topmost one of the interconnect dielectric layers (104 of FIG. 2) is omitted in FIG. 3 to expose the gate electrode layers 106 for ease of understanding in FIG. 3. In some embodiments, the gate electrode layer 106 comprises a conductive or semiconductor material such as, for example, titanium nitride, tungsten, tantalum nitride, copper, polysilicon, or the like. In some embodiments, the source/drain conductive lines 108 comprise a conductive material such as, for example, titanium nitride, tungsten, tantalum nitride, copper, or some other suitable conductive material. In some embodiments, the channel layer 110 comprises a semiconductor material such as, for example, poly-silicon, amorphous-silicon, oxide-semiconductor material, indium gallium zinc oxide, or some other suitable semiconductor material.

In some embodiments, each memory cell 122 is turned "ON" by applying signals (e.g., current, voltage) to the source/drain conductive lines 108 and gate electrode layer 106 through access circuitry. Then, the channel layer 110 may be turned "ON" to cause mobile charge carriers (e.g., electrons, holes) to flow between the source/drain conductive lines 108. In some embodiments, each memory cell 122 comprises a first transistor 302a and arranged on a first side of the first barrier structure 114 and a second transistor 302b arranged on a second side of the first barrier structure 114. The first transistor 302a is turned "ON" when mobile charge carriers flow through a first channel region 110a of the channel layer 110 on the first side of the first barrier structure 114, and the second transistor 302b is turned "ON" when mobile charge carriers flow through a second channel region 110b of the channel layer 110 on the second side of the first barrier structure 114. In some embodiments, the first and second transistors 302a, 302b may be accessed at the same time, as the first and second transistors 302a, 302b are coupled to the same source/drain conductive lines 108. In some other embodiments, the first and second transistors 302a, 302b may be accessed separately because the gate electrode layer 106 on the first side of the first barrier structure 114 may be electrically isolated from the gate electrode layer 106 on the second side of the first barrier structure 114.

In some embodiments, based on the signals (e.g., current, voltage) applied to the source/drain conductive lines 108 and the gate electrode layer 106, as well as the mobile charge carriers flowing through the channel layer 110, a data state (e.g., a '1' or a '0') may be written onto the memory layer 112. Further, data states may be read from the memory layer 112 using a different amplitude of signals (e.g., current, voltage) than the signals (e.g., current, voltage) used to write a data state onto the memory layer 112. Because of the first and second protective liner layers 118, 120, the first and second barrier structures 114, 116 stay in tact during manufacturing to provide sufficient electrical isolation within and between memory cells 122 to increase reliability of the 3D NOR type memory array.

Figure 4:
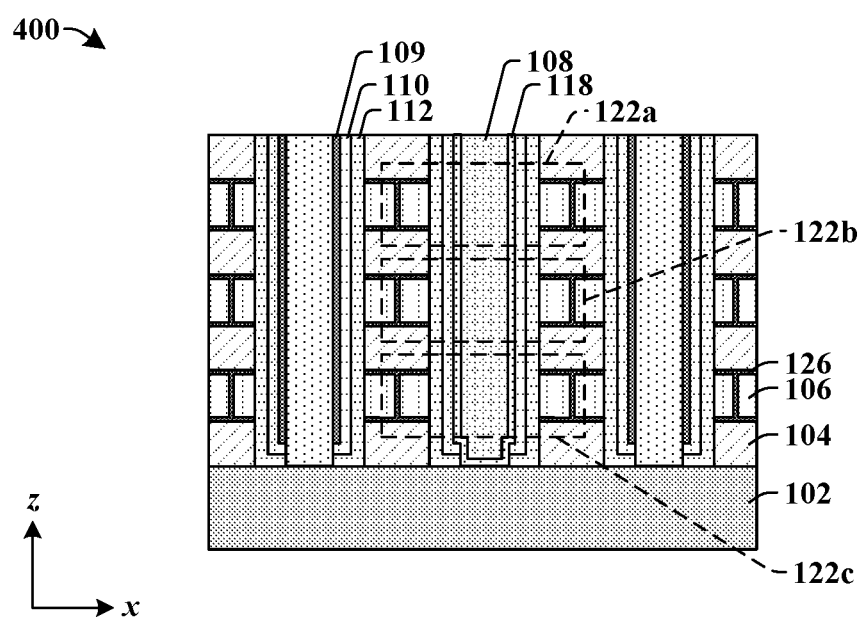
FIGS. 4 and 5 illustrate cross-sectional views of some embodiments of an integrated chip comprising a 3D NOR type memory arranged having protective liner layers around barrier structures.

FIG. 4 illustrates a cross-sectional view 400 of some embodiments of a 3D NOR type memory array on an xz-plane. In some embodiments, the cross-sectional view 400 of FIG. 4 corresponds to cross-section line AA' of FIG. 2.

In some embodiments, multiple gate electrode layers 106 are arranged over the substrate 102 and spaced apart from one another in the z-direction by the interconnect dielectric layers 104. In some embodiments, the source/drain conductive line 108 extends from an uppermost one of the interconnect dielectric layers 104 and towards the substrate 102. In some embodiments, outermost sidewalls of the source/drain conductive line 108 contact the first protective liner layer 118. Further, in some embodiments, the channel layer 110 is arranged on outermost sidewalls of the first protective liner layer 118, and the memory layer 112 is arranged on outermost sidewalls of the channel layer 110.

In some embodiments, the cross-sectional view 400 of FIG. 4 includes features of three different memory cells. For example, in some embodiments, an uppermost one of the gate electrode layers 106 and the source/drain conductive line 108 correspond to a first memory cell 122a; a middle one of the gate electrode layers 106 and the source/drain conductive line 108 correspond to a second memory cell 122b; and a lowermost one of the gate electrode layers 106 and the source/drain conductive line 108 correspond to a third memory cell 122c. When the first, second, and third memory cells 122a, 122b, 122c are turned "ON," mobile charge carriers may flow through the channel layer 110 in a direction that is into and out of the page.

Thus, because memory cells 122 are stacked in the z-direction and also in the y- and x-directions as shown in FIG. 3, for example, the memory cells 122 are arranged in a 3D NOR type memory array, which increases the number of memory cells 122 arranged over an area of the substrate 102 (i.e., increases the device density).

Figure 5:
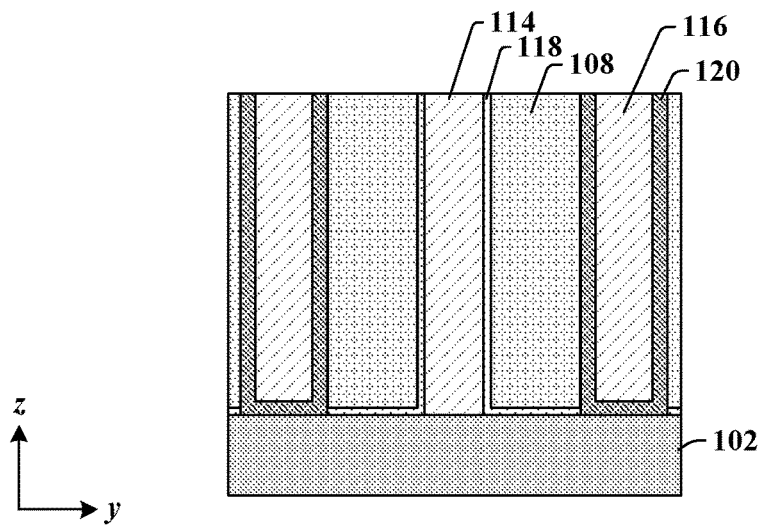

FIG. 5 illustrates a cross-sectional view 500 of some embodiments of a 3D NOR type memory array on a yz-plane. In some embodiments, the cross-sectional view 500 of FIG. 5 corresponds to cross-section line BB' of FIG. 2.

The cross-section line BB' of FIG. 2 extends through the first and second barrier structures 114, 116 in the y-direction. In some embodiments, the first protective liner layer 118 and the second protective liner layer 120 are arranged directly on the substrate 102. In some embodiments, outermost sidewalls of the first barrier structure 114 that are normal to the y-direction are covered by the first protective liner layer 118. In some embodiments, the bottommost surface of the first barrier structure 114 directly contacts the substrate 102. In some embodiments, the second protective liner layer 120 continuously surrounds the outer sidewalls and lower surface of the second barrier structures 116. In some embodiments, the first protective liner layer 118 and the second protective liner layer 120 surround outer sidewalls and lower surfaces of the source/drain conductive lines 108. Thus, during manufacturing when sacrificial structures are removed and replaced by the source/drain conductive lines 108, the first and second protective liner layers 118, 120 protect the first and second barrier structures 114, 116 to increase reliability of the overall device.

FIGS. 6-26 illustrate perspective views 600-2600 of some embodiments of a method of forming a 3D NOR type memory array of forming first and second barrier structures surrounded by first and second protective liner layers, respectively, to mitigate removal of the first and second barrier structures during future processing steps. Although FIGS. 6-26 are described in relation to a method, it will be appreciated that the structures disclosed in FIGS. 6-26 are not limited to such a method, but instead may stand alone as structures independent of the method.

Figure 6:
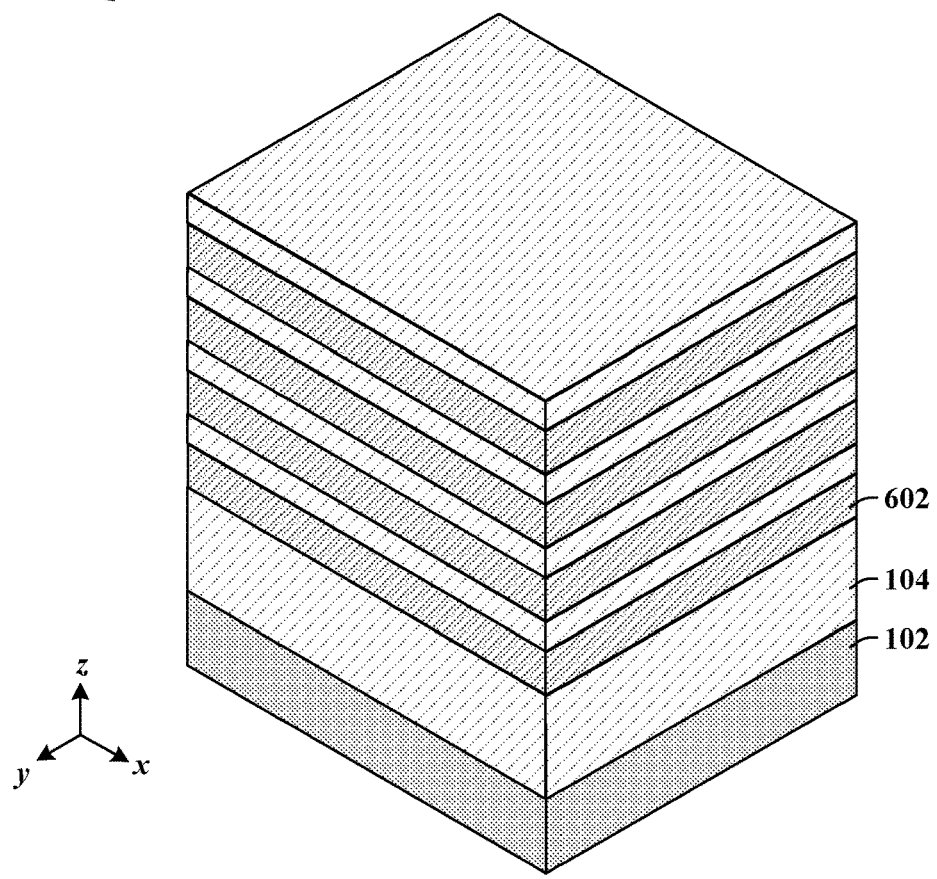
FIGS. 6-26 illustrate perspective views of some embodiments of a method of forming a 3D NOR type memory array comprising protective liner layers around barrier structures to reduce removal of portions of the barrier structures during various patterning processes thereby improving isolation between different memory cells.

As shown in perspective view 600 of FIG. 6, in some embodiments, dummy gate electrode layers 602 arranged between interconnect dielectric layers 104 are formed over a substrate 102. An interconnect dielectric layer 104 is arranged above and below each dummy gate electrode layer 602. In some embodiments, the substrate 102 comprises any type of semiconductor body (e.g., silicon/CMOS bulk, SiGe, SOI, etc.) such as a semiconductor wafer or one or more on a wafer as well as any other type of semiconductor and/or epitaxial layers formed thereon or otherwise associated therewith.

In some embodiments, the interconnect dielectric layers 104 comprise, for example, a dielectric material such as a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the interconnect dielectric layers 104 are formed by way of a deposition process (e.g., chemical vapor deposition (CVD), physical vapor deposition (PVD), atomic layer deposition (ALD), etc.). In some embodiments, a bottommost one of the interconnect dielectric layers 104 is thicker than other ones of the interconnect dielectric layers 104. In some other embodiments, each interconnect dielectric layer 104 may have a substantially same thickness. In some embodiments, a topmost one of the interconnect dielectric layers 104 is arranged over a topmost one of the dummy gate electrode layers 602.

In some embodiments, the dummy gate electrode layers 602 comprise, for example, silicon nitride, silicon carbide, or the like. In some embodiments, the dummy gate electrode layers 602 comprise a different material than the interconnect dielectric layers 104 such that the dummy gate electrode layers 602 may be later removed and replaced by a conductive material to form gate electrode layers. In some embodiments, the dummy gate electrode layers 602 may be formed by way of a deposition process (e.g., CVD, PVD, ALD, etc.).

Figure 7:
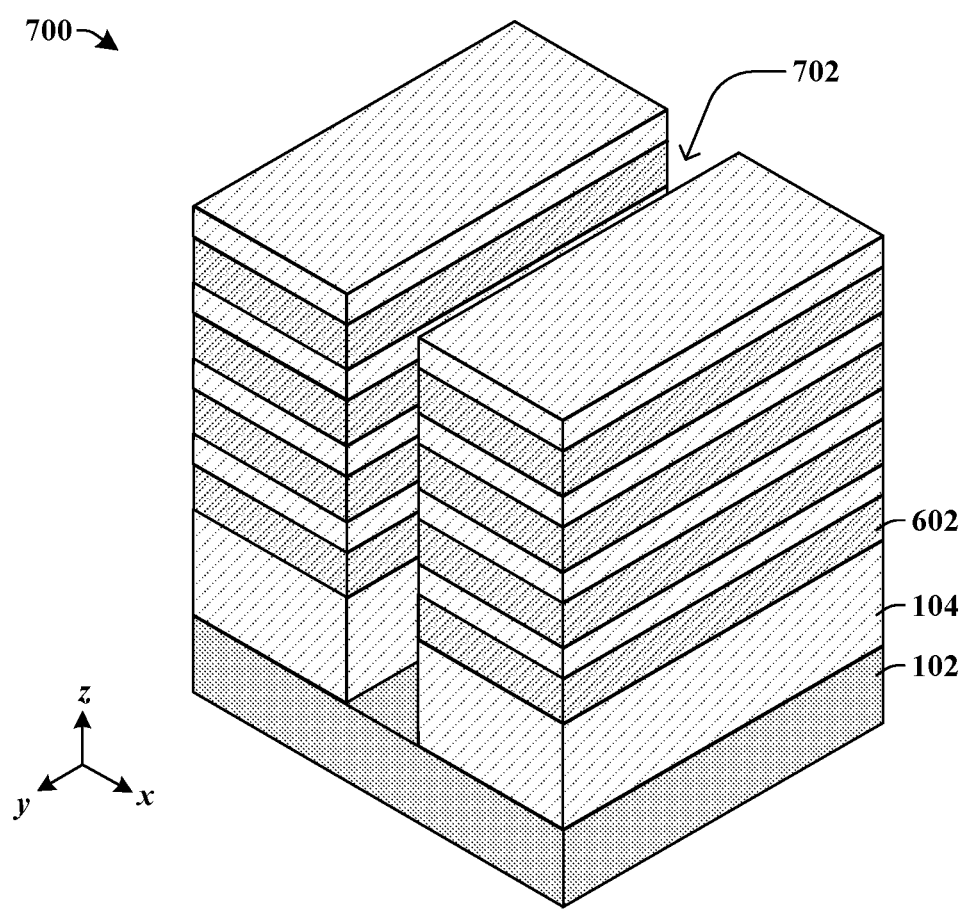

As shown in perspective view 700 of FIG. 7, a removal process is performed to form a first trench 702 within the interconnect dielectric layers 104 and the dummy gate electrode layers 602. In some embodiments, the first trench 702 exposes an upper surface of the substrate 102. In some embodiments, the first trench 702 is formed by forming a masking structure over the interconnect dielectric layers 104 through various steps of deposition (e.g., PVD, CVD, ALD, spin-on, etc.), photolithography, and removal (e.g., etching, chemical mechanical planarization (CMP)) processes. After the formation of the masking structure over the interconnect dielectric layers 104, the removal process of FIG. 7 is performed to remove portions of the interconnect dielectric layers 104 and the dummy gate electrode layers 602 according to openings in the masking structure. In some embodiments, the removal process of FIG. 7 comprises a wet and/or dry etching process. In some embodiments, more than one first trench 702 may be formed in the interconnect dielectric layers 104 and the dummy gate electrode layers 602.

Figure 8:
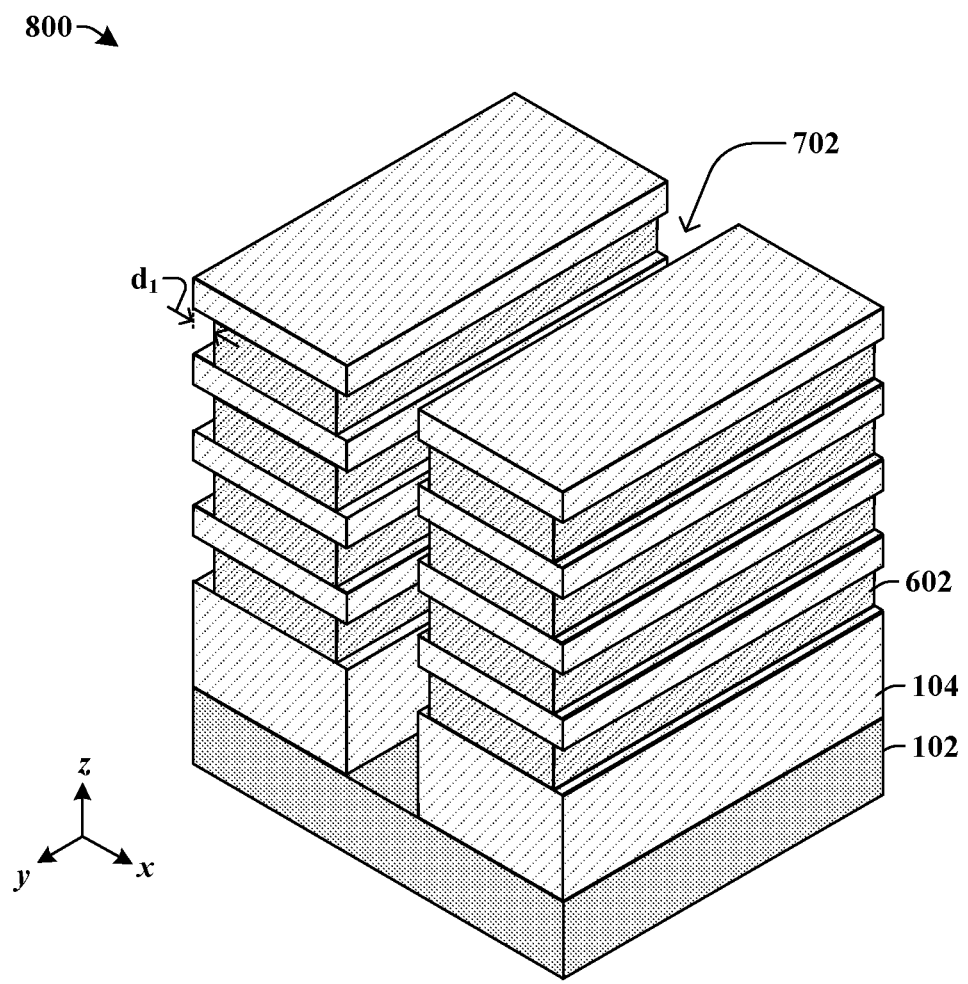

As shown in perspective view 800 of FIG. 8, in some embodiments, a removal process is performed to remove portions of the dummy gate electrode layers 602 in the x-direction. Thus, in some embodiments, after the removal process of FIG. 8, the dummy gate electrode layers 602 are narrower than the interconnect dielectric layers 104. In some embodiments, the dummy gate electrode layers 602 are reduced in width, measured in the x-direction, by two times a first distance $d_1$. In some embodiments, the removal process of FIG. 8 comprises an isotropic wet or dry etchant such that portions of the dummy gate electrode layers 602 are removed in the x-direction.

Figure 9:
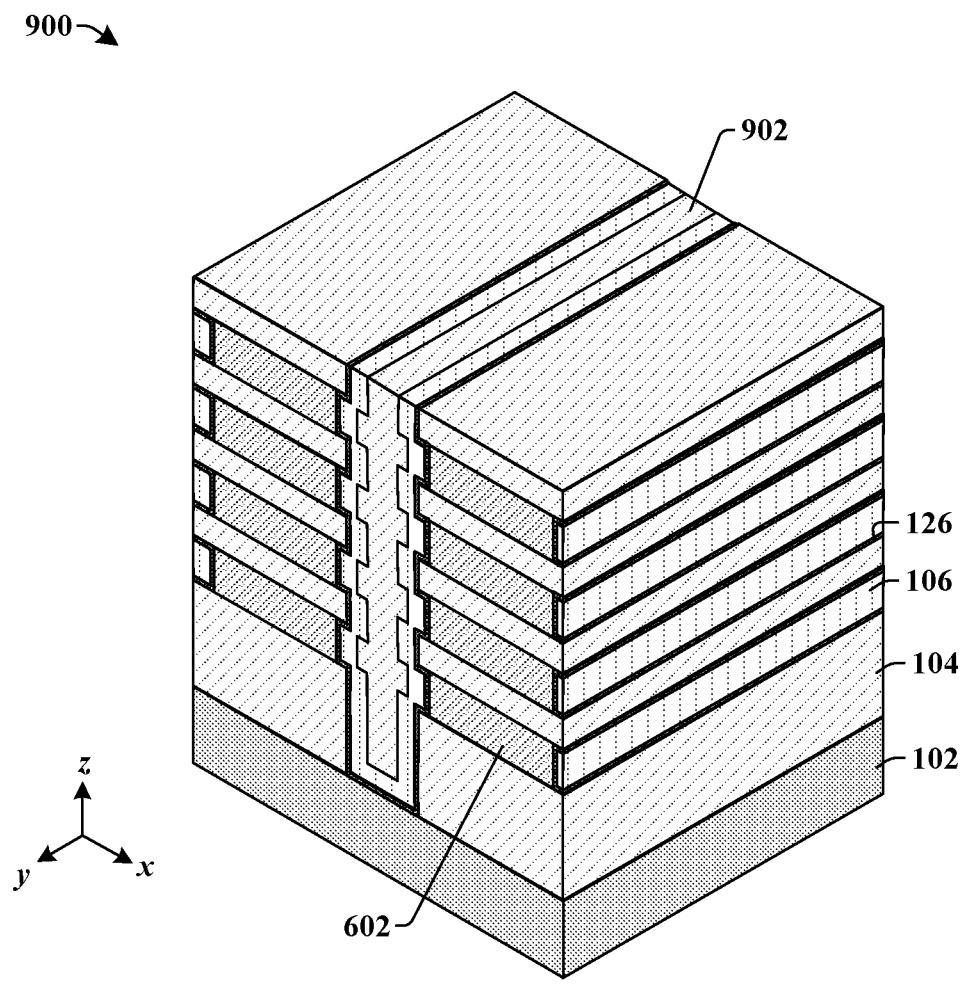

As shown in perspective view 900 of FIG. 9, in some embodiments, a gate dielectric layer 126 is formed on exposed surfaces of the dummy gate electrode layers 602, the substrate 102, and the interconnect dielectric layers 104. Further, in some embodiments, a conductive material is formed on surfaces of the gate dielectric layer 126 to form gate electrode layers 106. In some embodiments, the gate dielectric layer 126 comprises, for example, titanium nitride, silicon dioxide, or some other suitable gate dielectric material. In some embodiments, the gate electrode layers 106 comprise, for example, titanium, tungsten, tantalum, copper, polysilicon, or some other suitable conductive material. In some embodiments, a first dielectric material 902 is then formed in remaining portions of the first trench (702 of FIG. 8). In some embodiments, the first dielectric material 902 comprises, for example, as a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

In some embodiments, the gate dielectric layer 126, the gate electrode layers 106, and the first dielectric material 902 may each be formed by a deposition process (e.g., PVD, CVD, ALD, sputtering, etc.). Further, in some embodiments, portions of the gate dielectric layer 126, the gate electrode layers 106, and the first dielectric material 902 arranged above a topmost one of the interconnect dielectric layers 104 are removed in by a planarization process (e.g., CMP).

Figure 10:
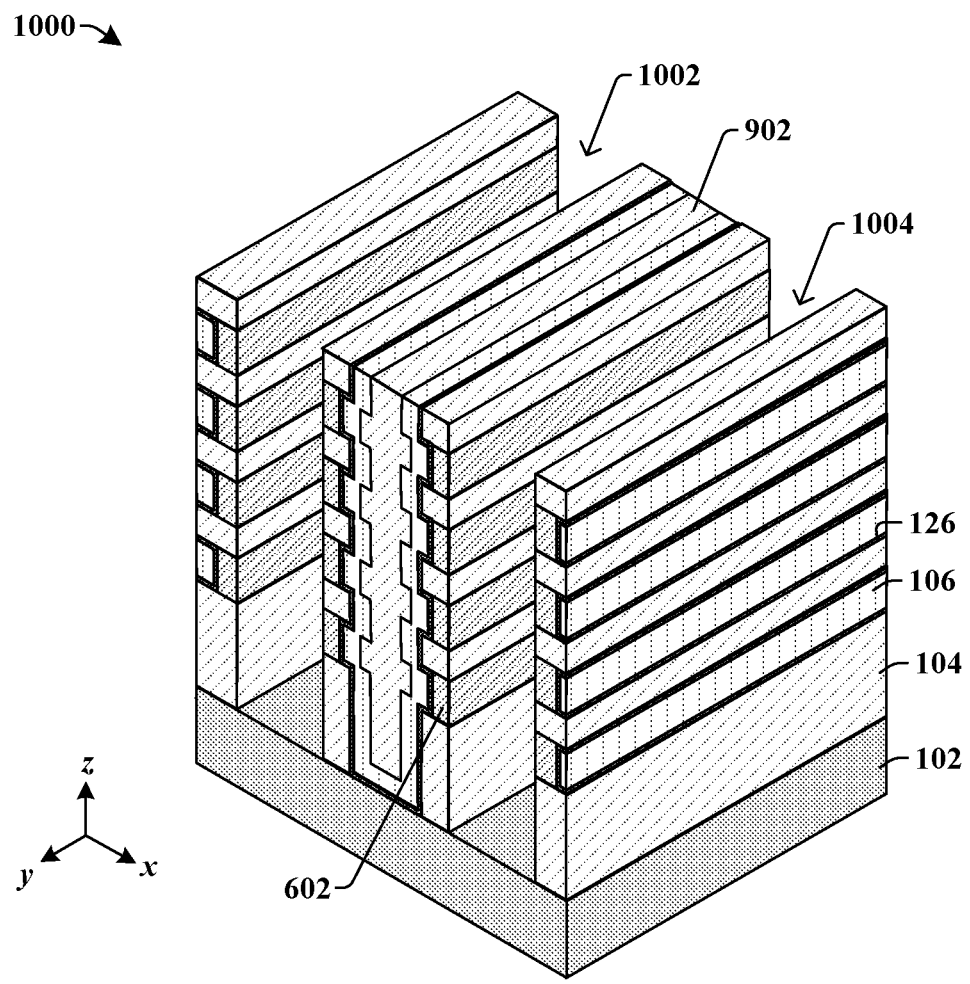

As shown in perspective view 1000 of FIG. 10, in some embodiments, a removal process is performed to form a second trench 1002 and a third trench 1004 in the interconnect dielectric layers 104 and the dummy gate electrode layers 602. In some embodiments, the first dielectric material 902 is arranged between the first and second trenches 1002, 1004. In some embodiments, the second and third trenches 1002, 1004 expose upper surfaces of the substrate 102. In some embodiments, the second and third trenches 1002, 1004 are formed by forming a masking structure over the interconnect dielectric layers 104 and removing portions of the interconnect dielectric layers 104 and dummy gate electrode layers 602 according to openings in the masking structure. In some embodiments, the removal process of FIG. 10 comprises a wet and/or dry etching process.

Figure 11:
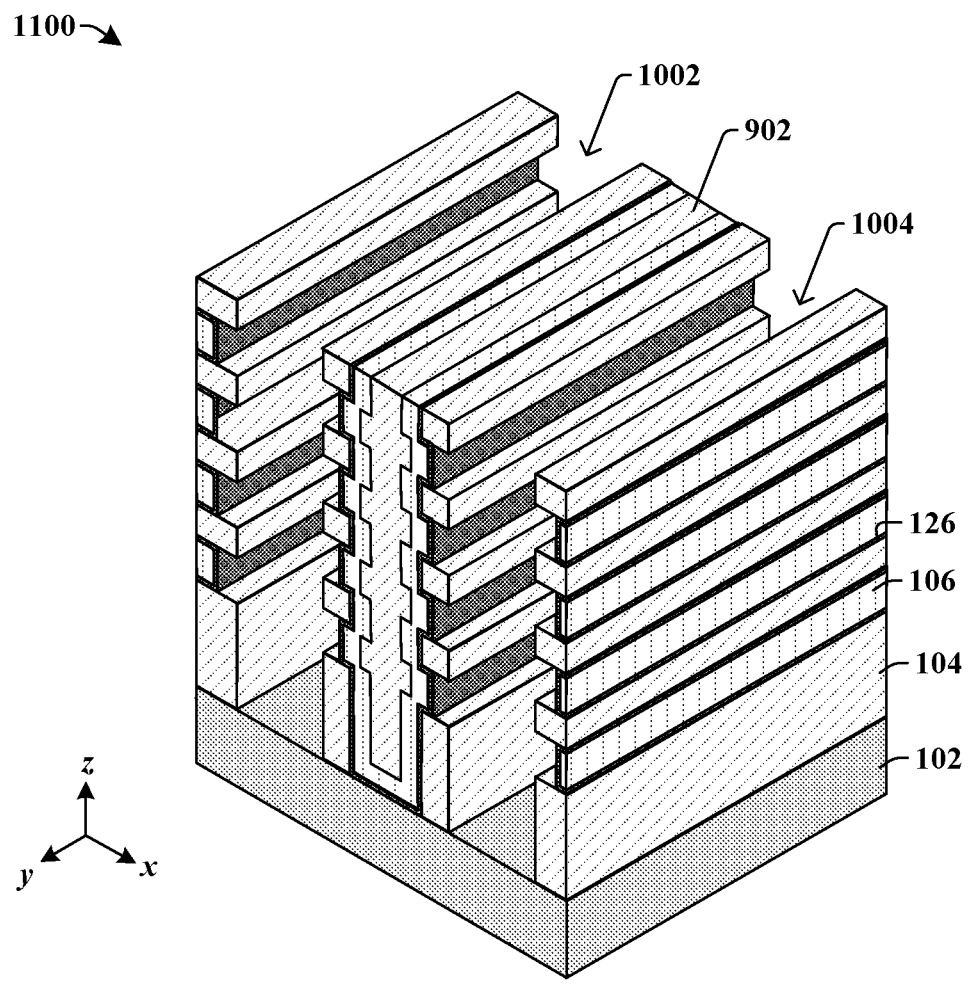

As shown in perspective view 1100 of FIG. 11, in some embodiments, the dummy gate electrode layers (602 of FIG. 10) are completely removed. In some embodiments, the dummy gate electrode layers (602 of FIG. 10) are completely removed by way of a wet or dry removal process. In some embodiments, the gate dielectric layer 126 and the interconnect dielectric layers 104 are substantially resistant to removal by the removal process of FIG. 11.

Figure 12:
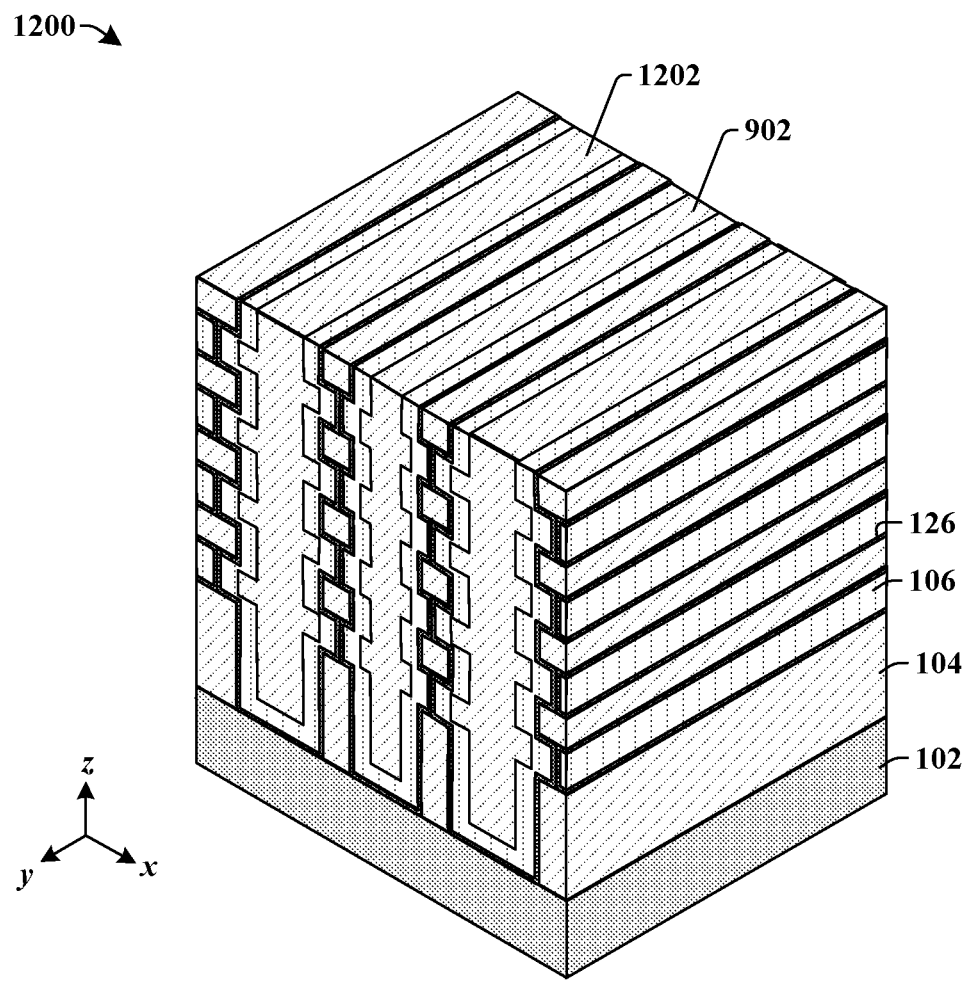

As shown in perspective view 1200 of FIG. 12, more of the gate dielectric layer 126 is formed on the gate dielectric layer 126 in FIG. 11 and on exposed portions of the interconnect dielectric layers 104 in FIG. 11. In some embodiments, more of the conductive material of the gate electrode layers 106 is formed on the gate dielectric layer 126 and within portions of the second and third trenches (1002, 1004 of FIG. 11). In some embodiments, a second dielectric material 1202 is then formed within the second and third trenches (1002, 1004 of FIG. 11). In some embodiments, the second dielectric material 1202 comprises a same or different dielectric material as the first dielectric material 902. In some embodiments, the second dielectric material 1202 is formed by way of a deposition process (e.g., PVD, CVD, ALD, etc.). In some embodiments, after the formation of the gate dielectric layer 126, gate electrode layer 106, and second dielectric material 1202, a planarization process (e.g., CMP) is performed to remove portions of the gate dielectric layer 126, gate electrode layer 106, and second dielectric material 1202 arranged over a topmost one of the interconnect dielectric layers 104.

Figure 13:
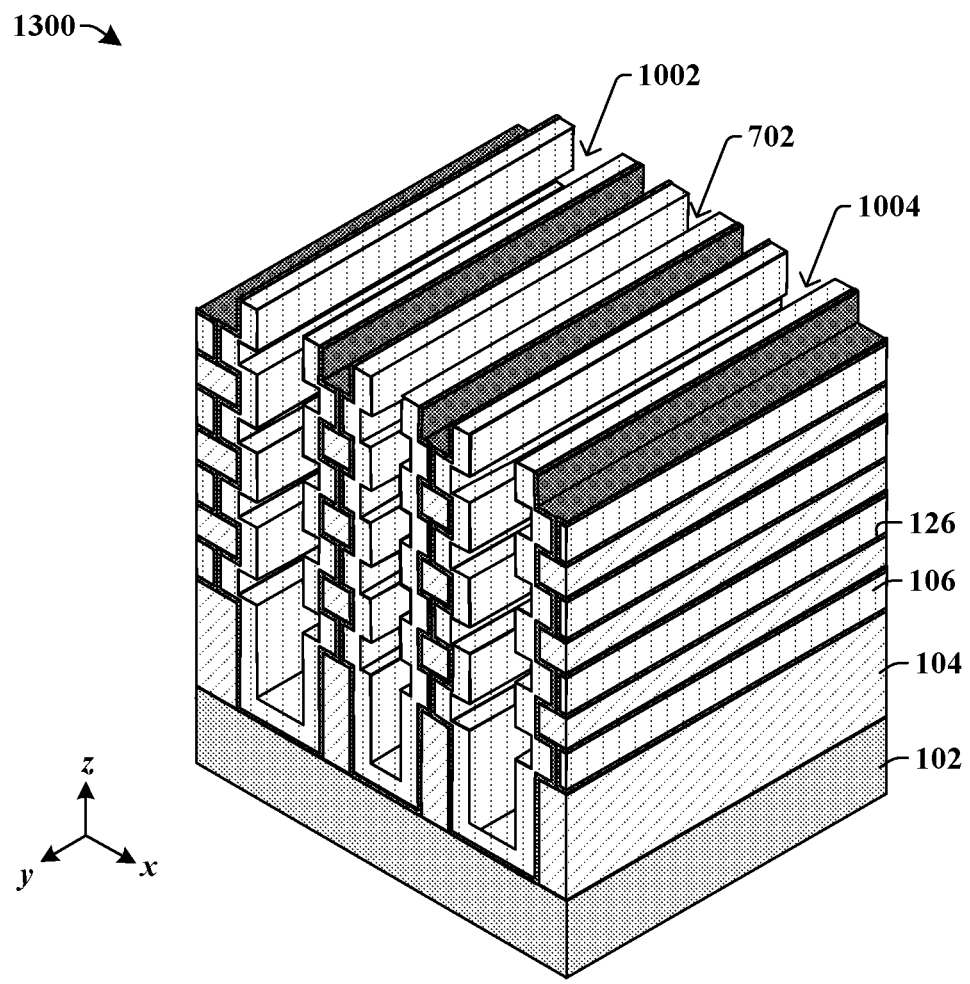

As shown in perspective view 1300 of FIG. 13, in some embodiments, the first and second dielectric materials (902, 1202 of FIG. 12) are completely removed from the gate electrode layers 106. Further, in some embodiments, a topmost one of the interconnect dielectric layers 104 in FIG. 12 are also removed by the removal process of FIG. 13. In some such embodiments, the interconnect dielectric layers 104, the first dielectric material (902 of FIG. 12), and the second dielectric material (1202 of FIG. 12) comprise a same material such that a same etchant(s) (e.g., wet and/or dry) may be used in the removal process of FIG. 13 to remove portions of the interconnect dielectric layers 104, the first dielectric material (902 of FIG. 12), and the second dielectric material (1202 of FIG. 12). In some other embodiments, the interconnect dielectric layers 104, the first dielectric material (902 of FIG. 12), and/or the second dielectric material (1202 of FIG. 12) may comprise different dielectric materials. In some such other embodiments, a same etchant may still be able to remove the interconnect dielectric layers 104, the first dielectric material (902 of FIG. 12), and the second dielectric material (1202 of FIG. 12), or different etchants may be used to remove the interconnect dielectric layers 104, the first dielectric material (902 of FIG. 12), and the second dielectric material (1202 of FIG. 12).

After the removal of the interconnect dielectric layers 104, the first dielectric material (902 of FIG. 12), and the second dielectric material (1202 of FIG. 12), the first trench 702, the second trench 1002, and the third trench 1004 are again exposed and are defined by surfaces of the gate electrode layers 106.

Figure 14:
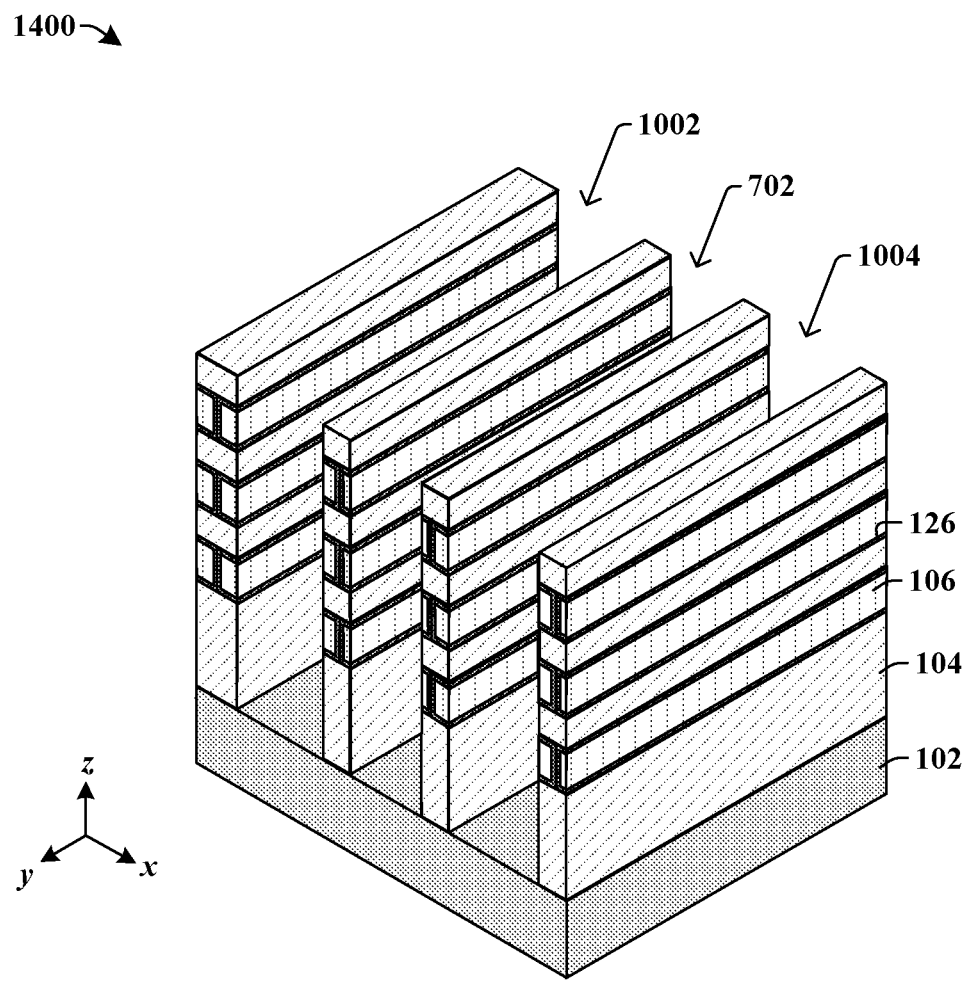

As shown in perspective view 1400 of FIG. 14, in some embodiments, a vertical etching process is performed to remove portions of the gate electrode layers 106 and the gate dielectric layer 126 that are not arranged directly between interconnect dielectric layers 104 in the z-direction. Thus, in some embodiments, after the vertical etching process of FIG. 14, each portion of the gate electrode layers 106 and the gate dielectric layers 126 are arranged above and below one of the interconnect dielectric layers 104. Thus, in some embodiments, the vertical etching process of FIG. 14 also removes portions of the gate electrode layers 106 and the gate dielectric layers 126 arranged on the substrate 102. In some embodiments, the vertical etching process of FIG. 14 comprises a dry etching process performed in the z-direction. In some such embodiments, the interconnect dielectric layers 104 and the substrate 102 are substantially resistant to removal by the vertical etching process of FIG. 14. Thus, in some embodiments, a masking structure is not need to perform the vertical etching process in FIG. 14 because a topmost one of the interconnect dielectric layers 104 of FIG. 14 act as a masking structure for the vertical etching process of FIG. 14.

Figure 15:
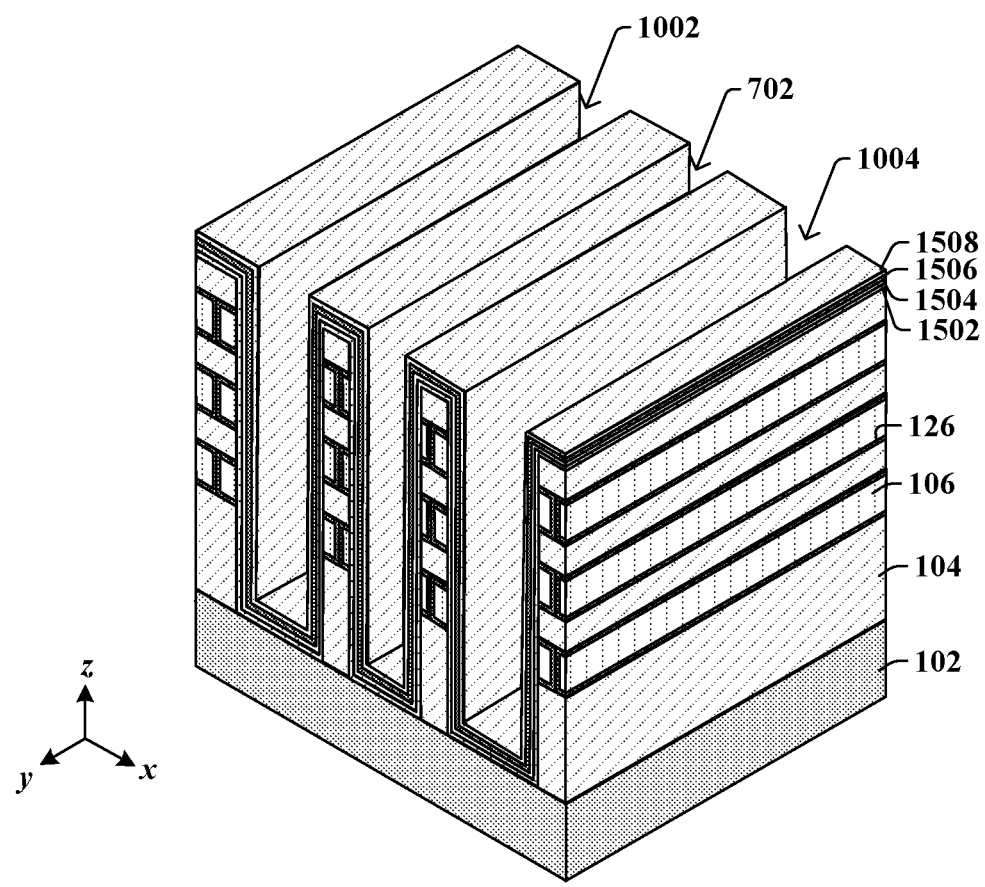

As shown in perspective view 1500 of FIG. 15, a continuous memory layer 1502 is formed over the substrate 102 and on the interconnect dielectric layers 104, the gate electrode layers 106, and the gate dielectric layers 126. In some embodiments, the continuous memory layer 1502 comprises, for example, a silicon dioxide-silicon nitride-silicon dioxide (ONO) structure, a ferroelectric material (e.g., hafnium oxide, hafnium zinc oxide, etc.), or some other suitable memory storage material. In some embodiments, a continuous channel layer 1504 is formed over the continuous memory layer 1502. In some embodiments, the continuous channel layer 1504 comprises, for example, a semiconductor material such as, for example, poly-silicon, amorphous-silicon, oxide-semiconductor material, indium gallium zinc oxide, or some other suitable semiconductor material.

In some embodiments, a continuous dielectric layer 1506 is then formed over the continuous channel layer 1504. In some embodiments, the continuous dielectric layer 1506 comprises, for example, a dielectric material such as a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, a third dielectric material layer 1508 is then formed over the continuous dielectric layer 1506. In some embodiments, the third dielectric material layer 1508 comprises a different dielectric material than the continuous dielectric layer 1506.

In some embodiments, the continuous memory layer 1502, the continuous channel layer 1504, the continuous dielectric layer 1506, and the third dielectric material layer 1508 are each formed by a deposition process (e.g., PVD, CVD, ALD, sputtering, etc.). In some embodiments, after the formation of the third dielectric material layer 1508, the first, second, and third trenches 702, 1002, 1004 have surfaces defined by the third dielectric material layer 1508.

Figure 16:
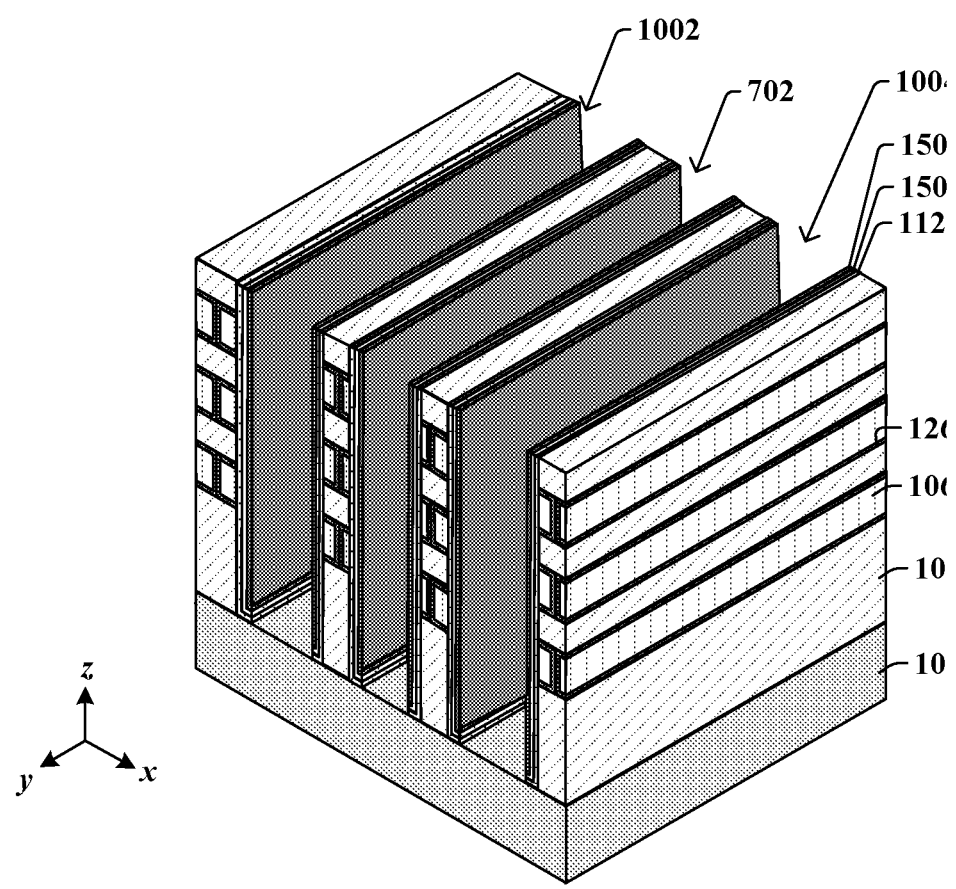

As shown in perspective view 1600 of FIG. 16, the third dielectric material layer (1508 of FIG. 15) is completely removed, and portions of the continuous memory layer (1502 of FIG. 15), the continuous channel layer 1504, and the continuous dielectric layer 1506 that are arranged directly over the interconnect dielectric layers 104 and directly on the substrate 102 are removed by a removal process. In some embodiments, a memory layer 112 is formed from the remaining portions of the continuous memory layer (1502 of FIG. 15) after the removal process of FIG. 16.

In some embodiments, the removal process of FIG. 16 may comprise multiple removal processing steps such as wet etching, dry etching, and/or CMP because of the various materials being removed in FIG. 16. In some embodiments, the removal process of FIG. 16 comprises etching processes performed in the substantial vertical direction to remove substantially horizontal portions of the continuous memory layer (1502 of FIG. 15), the continuous channel layer 1504, and the continuous dielectric layer 1506. In some embodiments, the interconnect dielectric layers 104 and the substrate 102 are substantially resistant to removal by the removal process of FIG. 16, and thus, a masking structure is not needed. In other embodiments, a masking structure may be used.

Figure 17:
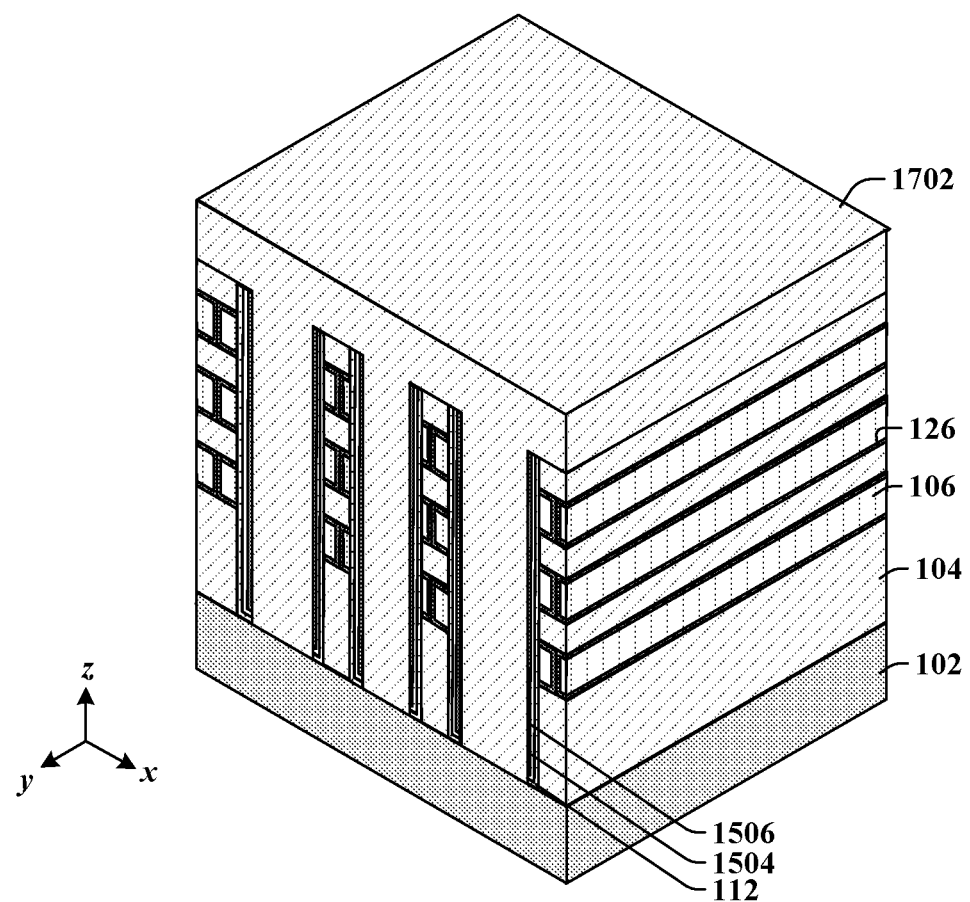

As shown in perspective view 1700 of FIG. 17, a fourth dielectric material 1702 is formed within the first, second, and third trenches (702, 1002, 1004). In some embodiments, the fourth dielectric material 1702 is formed by way of a deposition process (e.g., PVD, CVD, ALD, etc.) followed by a planarization process (e.g., CMP) and may comprise, for example, a dielectric material such as a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

Figure 18:
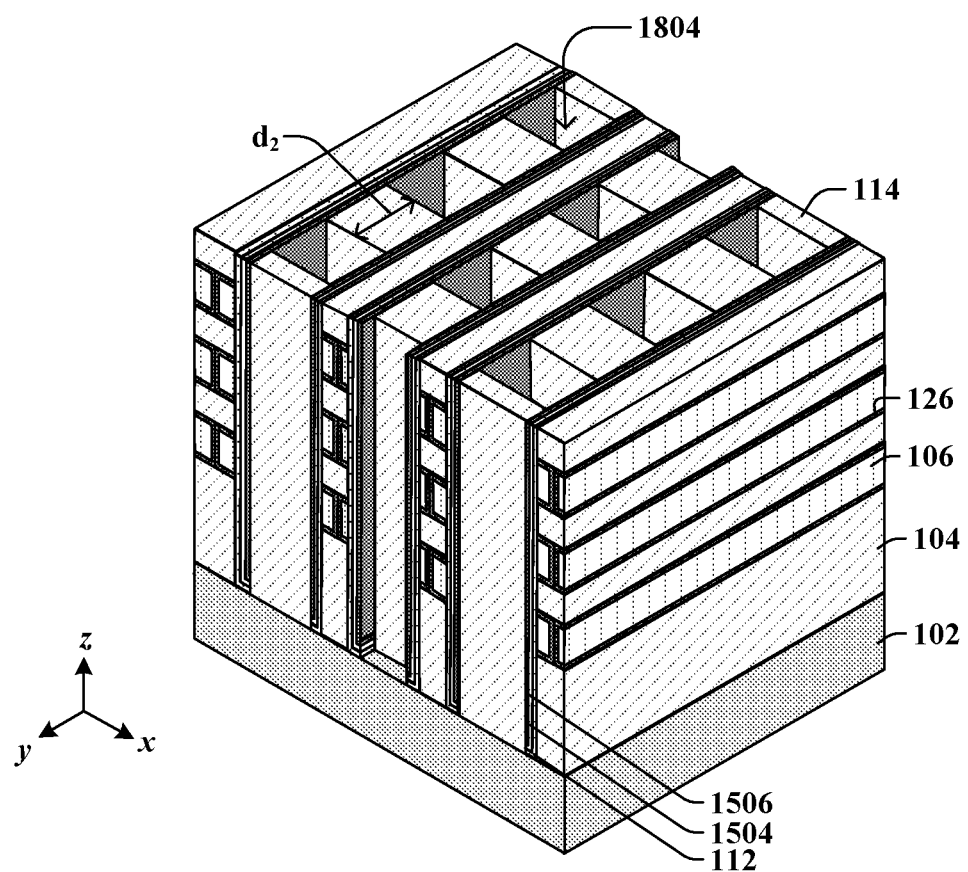

As shown in perspective view 1800 of FIG. 18, in some embodiments, a planarization process is performed to remove portions of the fourth dielectric material (1702 of FIG. 17) arranged over topmost ones of the interconnect dielectric layers 104. Further, in some embodiments, a patterning process is performed to form fourth openings 1804 in the fourth dielectric material (1702 of FIG. 17). In some embodiments, the fourth openings 1804 extend from a topmost surface of the interconnect dielectric layers 104 to upper surfaces of the substrate 102. In some embodiments, a masking structure is formed through various steps of deposition (e.g., PVD, CVD, ALD, spin-on, etc.), photolithography, and removal (e.g., etching, CMP) processes, and the patterning process of FIG. 18 is performed according to openings in the masking structure. Thus, in some embodiments, the fourth openings 1804 may correspond to openings in the masking structure. In some embodiments, the patterning process comprises an etchant used to remove the portions of the fourth dielectric material (1702 of FIG. 17). In some embodiments, the continuous dielectric layer 1506 and the substrate 102 are substantially resistant to removal by the etchant.

In some embodiments, after the patterning process, the remaining portions of the fourth dielectric material (1702 of FIG. 17) form first barrier structures 114. In some embodiments, the first barrier structures 114 have a height measured in the y-direction equal to a second distance $d_2$. In some embodiments, in the x-direction, the first barrier structures 114 alternate with the fourth openings 1804. For example, in some embodiments, first barrier structures 114 surround a fourth opening 1804 in the x-direction.

Figure 19:
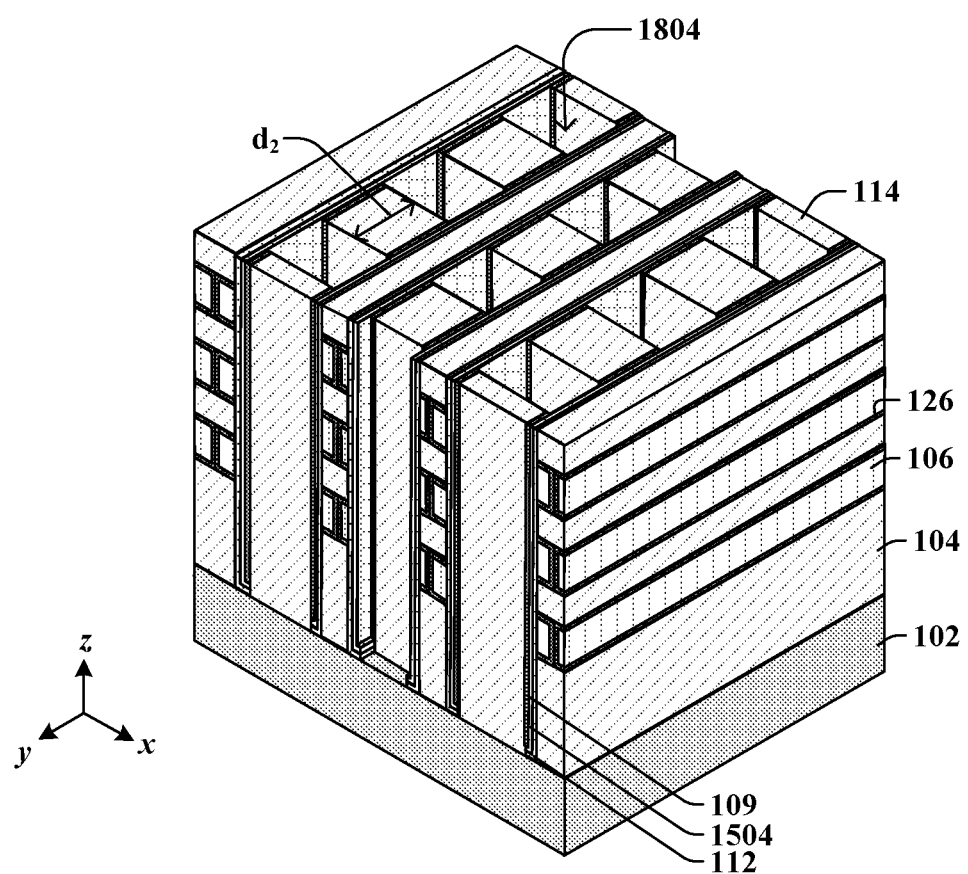

As shown in perspective view 1900 of FIG. 19, in some embodiments, exposed portions of the continuous dielectric layer (1506 of FIG. 18) that defined the fourth openings 1804 in FIG. 18 are removed by a removal process. In some such embodiments, the removal process of FIG. 19 may comprise a wet or dry etchant. In some such embodiments, the first barrier structures 114 and the continuous channel layer 1504 are substantially resistant to removal by the removal process of FIG. 19. In some embodiments, the remaining portions of the continuous dielectric layer (1506 of FIG. 18) form a dielectric layer 109 arranged on outer sidewalls of the first barrier structures 114.

Figure 20:
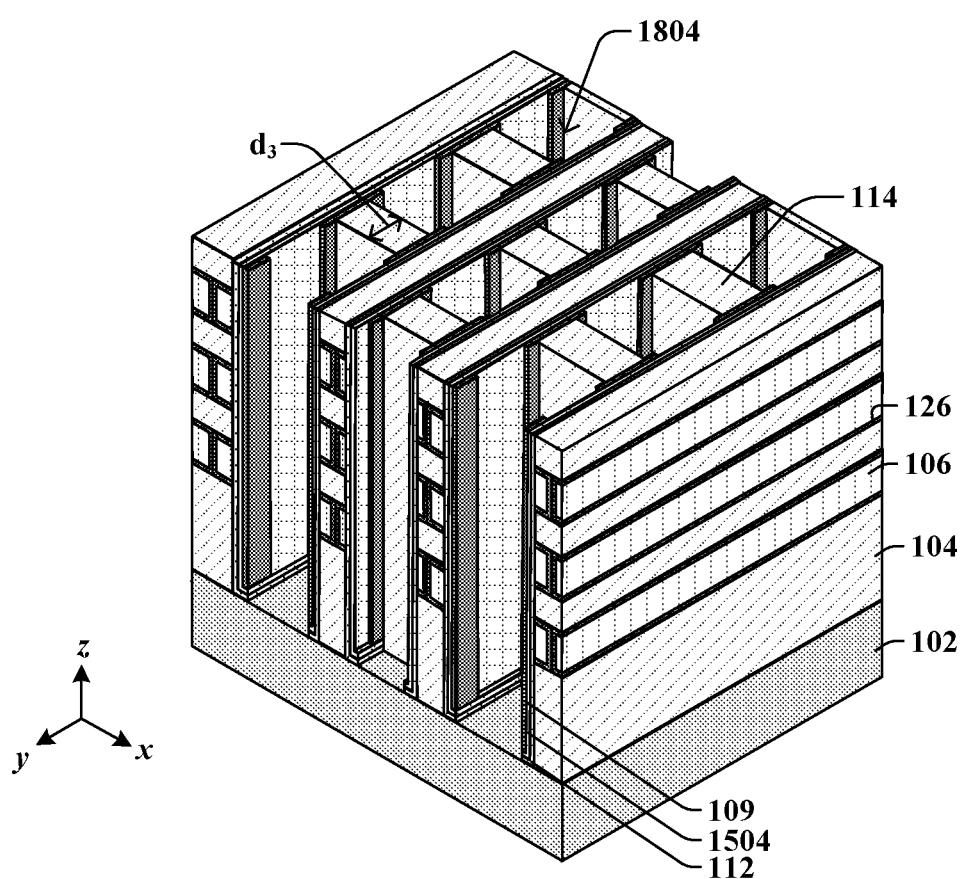

As shown in perspective view 2000 of FIG. 20, portions of the first barrier structures 114 are removed in the y-direction such that the height of the first barrier structures 114 is reduced from the second distance ($d_2$ of FIG. 19) to a third distance $d_3$. In some embodiments, a masking structure is used for the removal process of FIG. 20, whereas in some other embodiments, a masking structure is not used for the removal process of FIG. 20. In some embodiments, a lateral etchant is used to reduce the height of the first barrier structures 114 in FIG. 20. In some embodiments, the dielectric layer 109 and the continuous channel layer 1504 are substantially resistant to removal by the removal process of FIG. 20.

Figure 21:
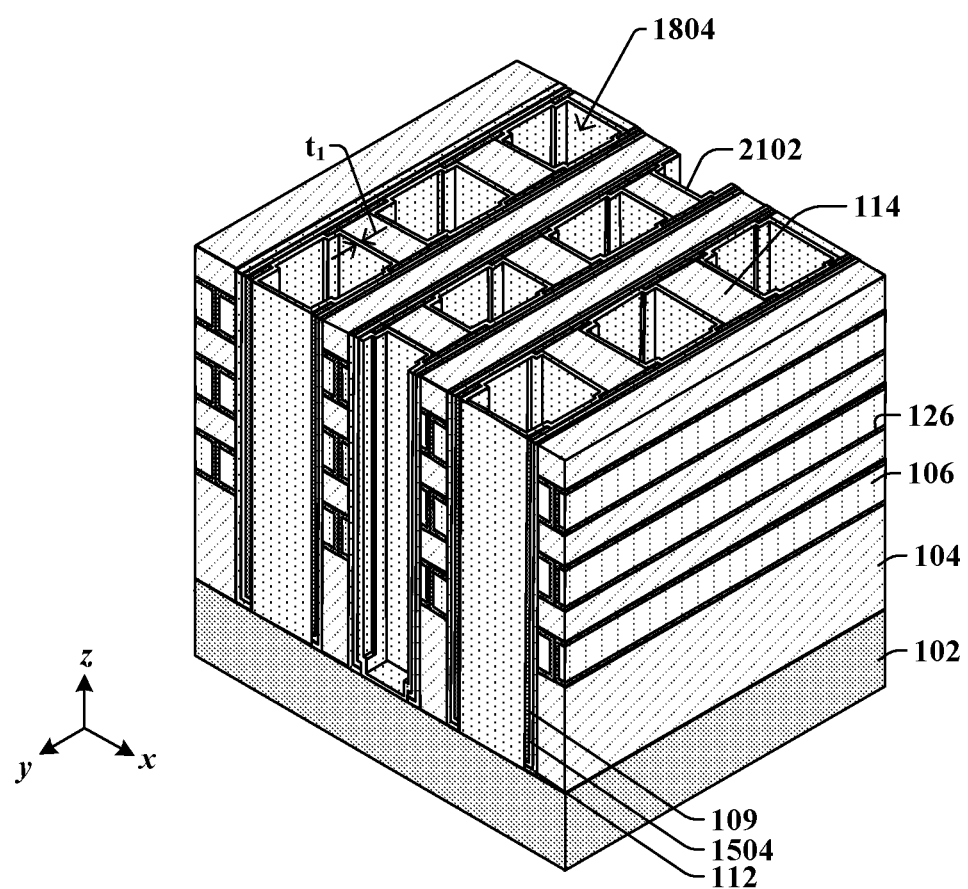

As shown in perspective view 2100 of FIG. 21, in some embodiments, a continuous protective liner layer 2102 is formed within the fourth openings 1804 such that surfaces of the continuous protective liner layer 2102 define the fourth openings 1804. In some such embodiments, the continuous protective liner layer 2102 is formed on surfaces of the first barrier structures 114, the dielectric layer 109, the substrate 102, and the continuous channel layer 1504. In some embodiments, the continuous protective liner layer 2102 has a first thickness $t_1$ measured in the y-direction that is in a range of between, for example, approximately 1 nanometer and approximately 100 nanometers.

In some embodiments, the continuous protective liner layer 2102 comprises a different material than the first barrier structures 114. In some embodiments, the continuous protective liner layer 2102 comprises a metal (e.g., titanium, titanium nitride), a metal oxide (e.g., aluminum oxide, hafnium oxide, titanium oxide), or some other material that is different than the first barrier structure 114. In some other embodiments, the continuous protective liner layer 2102 may comprise a semiconductor material that has a different composition, dopant concentration, structure, or some other characteristic than the continuous channel layer 1504, which may also comprise a semiconductor material. In some embodiments, the continuous protective liner layer 2102 is formed by a deposition process (e.g., PVD, CVD, ALD, sputtering, etc.).

Figure 22:
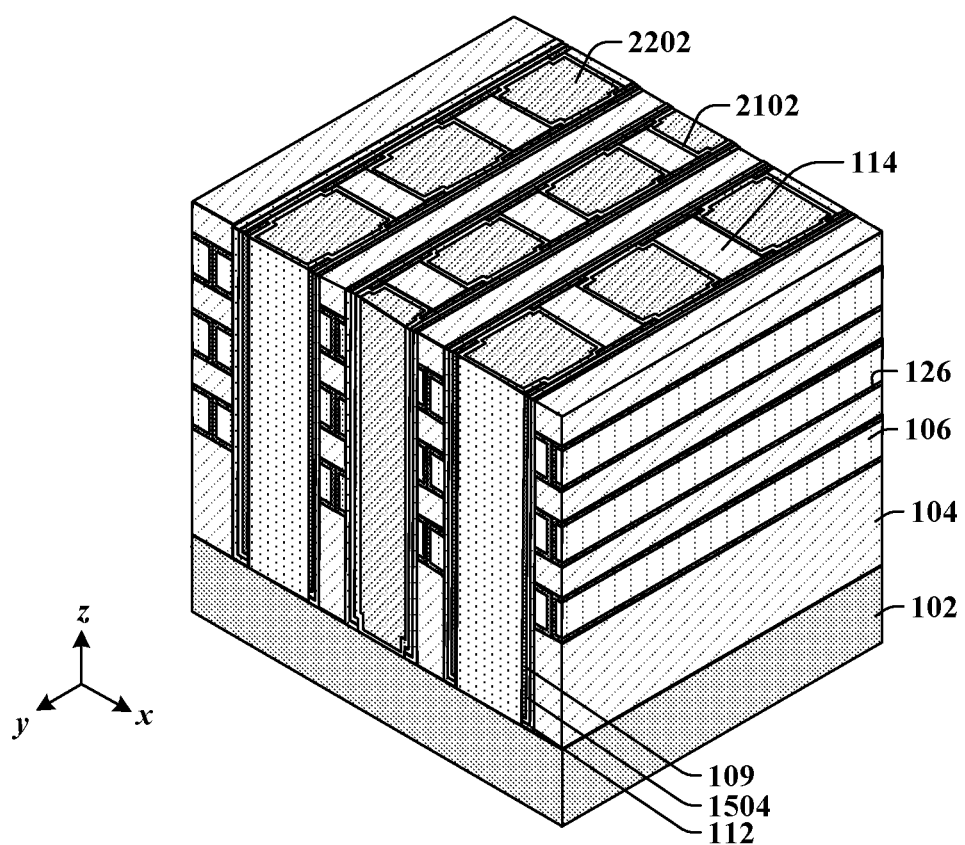

As shown in perspective view 2200 of FIG. 22, in some embodiments, sacrificial structures 2202 are formed within and completely fill the fourth openings (1804 of FIG. 21). In some embodiments, the sacrificial structures 2202 comprise, for example, silicon nitride, silicon carbide, silicon dioxide, or some other material that is different than the continuous protective liner layer 2102. In some embodiments, the sacrificial structures 2202 are formed by a deposition process (e.g., PVD, CVD, ALD, etc.).

Figure 23:
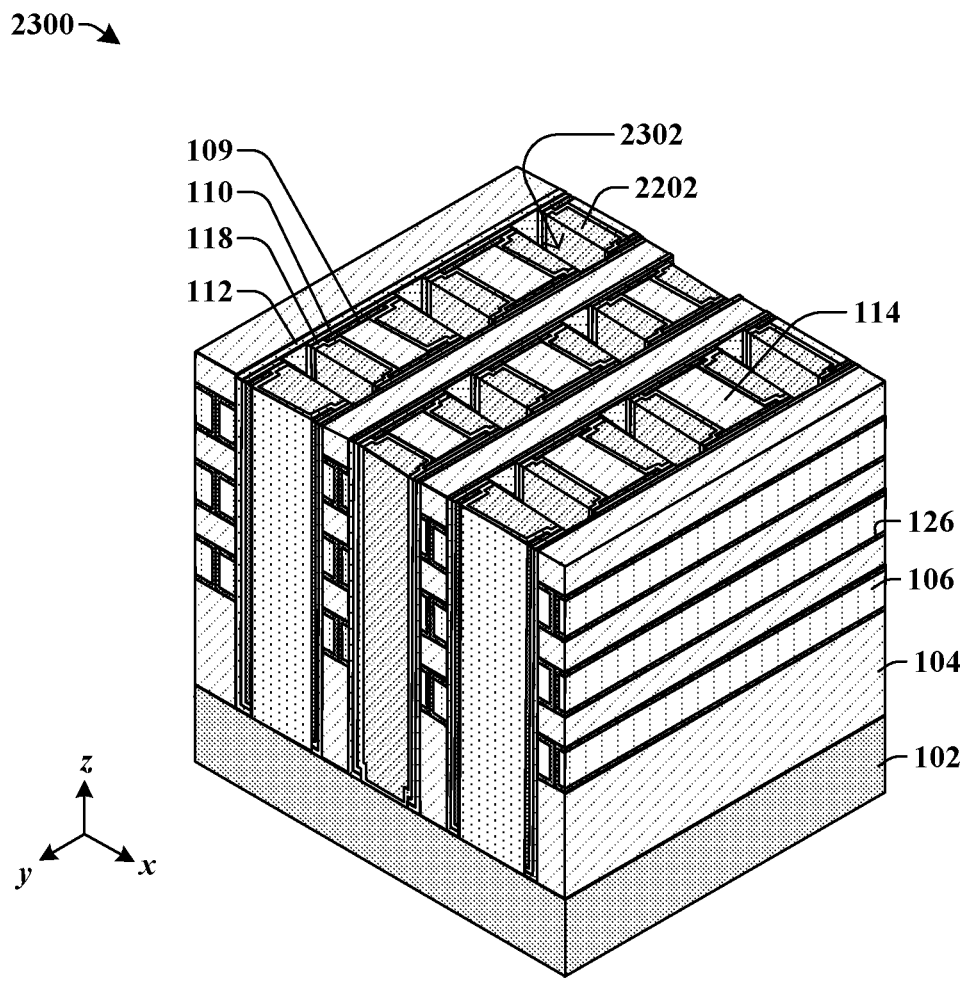

As shown in perspective view 2300 of FIG. 23, portions of the continuous channel layer (1504 of FIG. 22), continuous protective liner layer (2102 of FIG. 22), and sacrificial structures 2202 are removed by a removal process to form fifth openings 2302 in the sacrificial structures 2202. In some such embodiments, a masking structure comprising openings is first formed over the interconnect dielectric layers 104, and then the removal process of FIG. 23 may be performed according to the openings of the masking structure to form the fifth openings 2302. In some embodiments, the removal process of FIG. 23 comprises one or more wet and/or dry etching processes. In some embodiments, a different etchant is used to remove each portions of each feature (e.g., 1504 of FIG. 22, 2102 of FIG. 22, 2202) to form the fifth openings 2302 in the sacrificial structures 2202. In some embodiments, after the removal process of FIG. 23, remaining portions of the continuous channel layer (1504 of FIG. 22) form a channel layer 110 and remaining portions of the continuous protective liner layer (2102 of FIG. 22) form a first protective liner layer 118.

Figure 24:
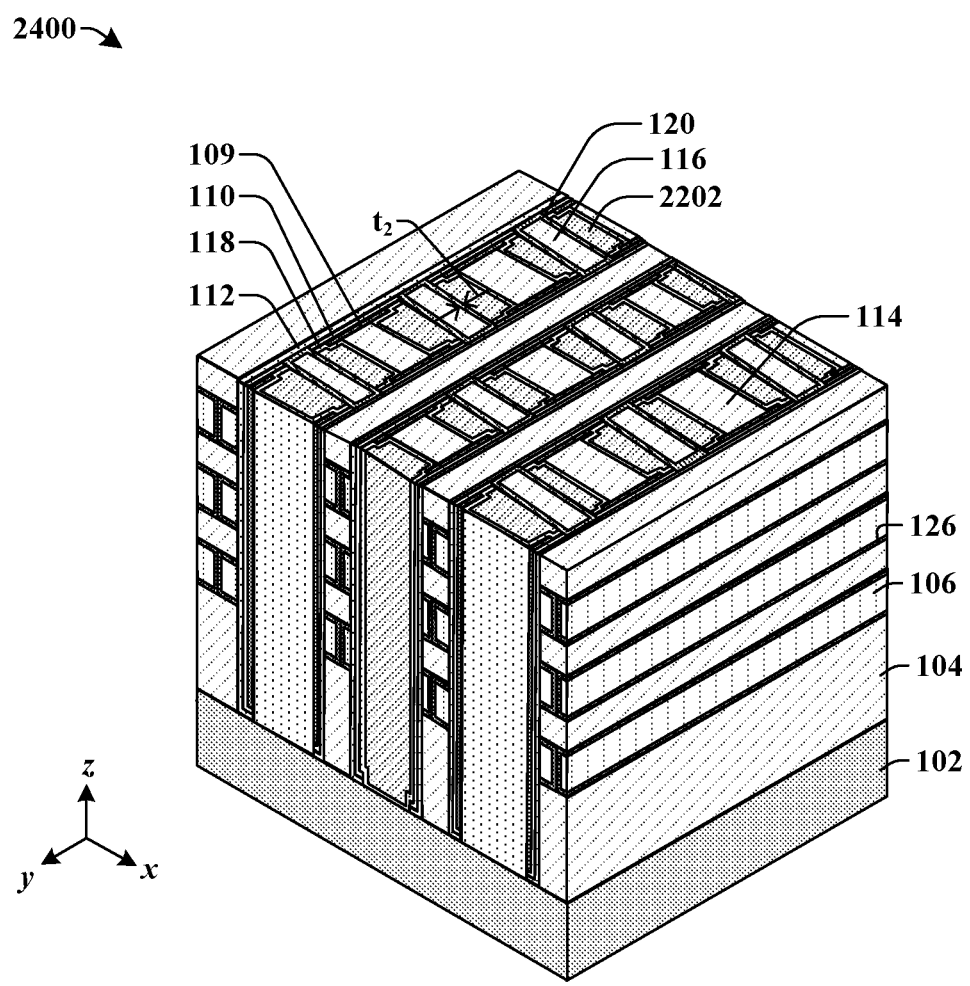

As shown in perspective view 2400 of FIG. 24, in some embodiments, a second protective liner layer 120 is formed to line the fifth openings (2302 of FIG. 23), and second barrier structures 116 are formed over the second protective liner layer 120 to completely fill the fifth openings (2302 of FIG. 23). In some embodiments, the second protective liner layer 120 and the second barrier structures 116 are formed by way of deposition processes (e.g., PVD, CVD, ALD, etc.). In some embodiments, the second protective liner layer 120 comprises a dielectric material such as, for example, silicon dioxide, aluminum oxide, or some other suitable low-k dielectric material. In some embodiments, the second protective liner layer 120 has a second thickness $t_2$ in a range of between, for example, approximately 1 nanometer and approximately 100 nanometers. In some embodiments, the second barrier structures 116 comprise, for example, a dielectric material such as a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. Further, the second barrier structures 116 comprise a different material than the second protective liner layer 120.

In some embodiments, outer surfaces of the sacrificial structures 2202 are all covered by the first protective liner layer 118 or the second protective liner layer 120. Further, in some embodiments, the first barrier structures 114 are spaced apart from the sacrificial structures 2202 by the first protective liner layer 118, and the second barrier structures 116 are spaced apart from the sacrificial structures 2202 by the second protective liner layer 120.

Figure 25:
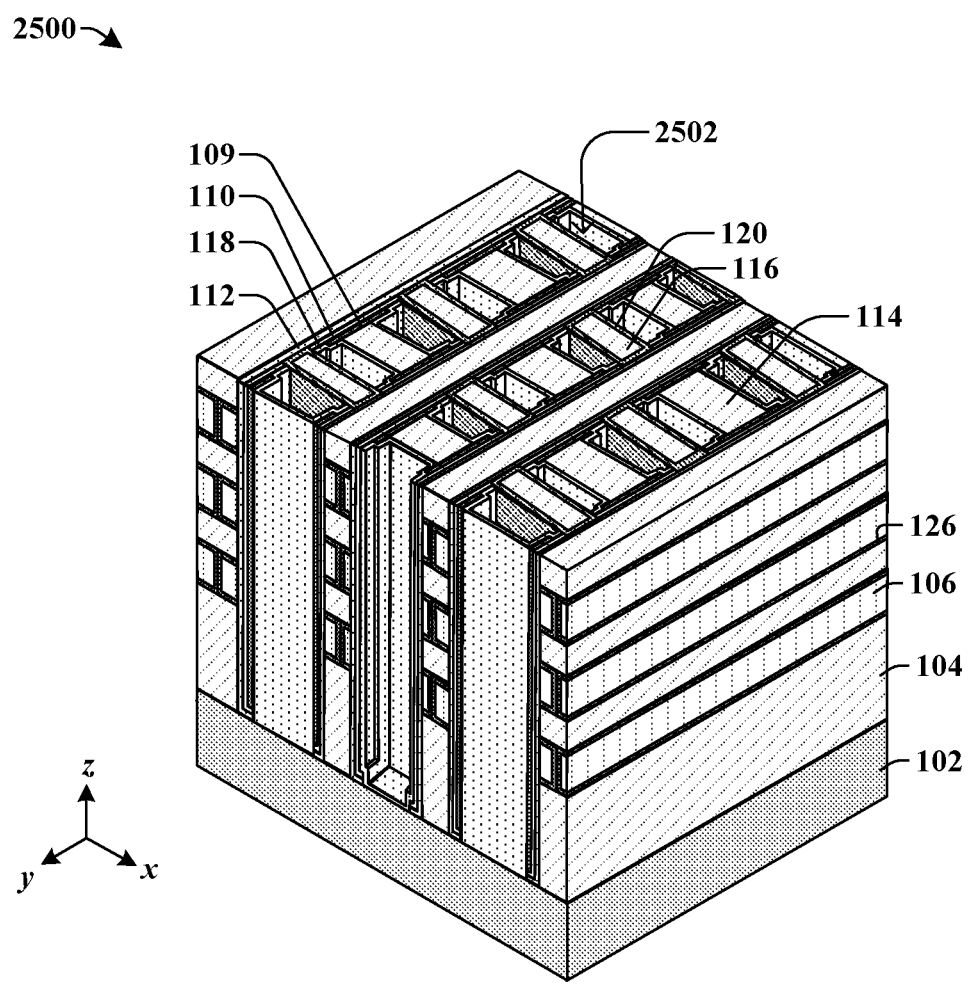

As shown in perspective view 2500 of FIG. 25, the sacrificial structures (2202 of FIG. 24) are completely removed from the substrate 102 thereby forming sixth openings 2502 defined by the first protective liner layer 118 and the second protective liner layer 120. In some embodiments, a wet etching process and/or a dry etching process are used to remove the sacrificial structures (2202 of FIG. 24).

In some embodiments, the etchant(s) used to remove the sacrificial structures (2202 of FIG. 24) are highly selective to the sacrificial structures (2202 of FIG. 24) compared to the first and second protective liner layers 118, 120. Thus, in some embodiments, the first and second protective liner layers 118, 120 have a significantly slower removal rate (i.e., are substantially resistant to removal) by the etchant(s) of FIG. 25 compared to the sacrificial structures (2202 of FIG. 24). As a result, the first and second protective liner layers 118, 120 prevent the etchant(s) of FIG. 25 from contacting and thus, removing, portions of the first and second barrier structures 114, 116 because in some embodiments, the first and second barrier structures 114, 116 comprise materials that have a higher rate of removal by the etchant(s) of FIG. 25 than materials of the first and second protective liner layers 118, 120. Therefore, the first and second protective liner layers 118, 120 preserve the first and second barrier structures 114, 116 previously formed.

Figure 26:
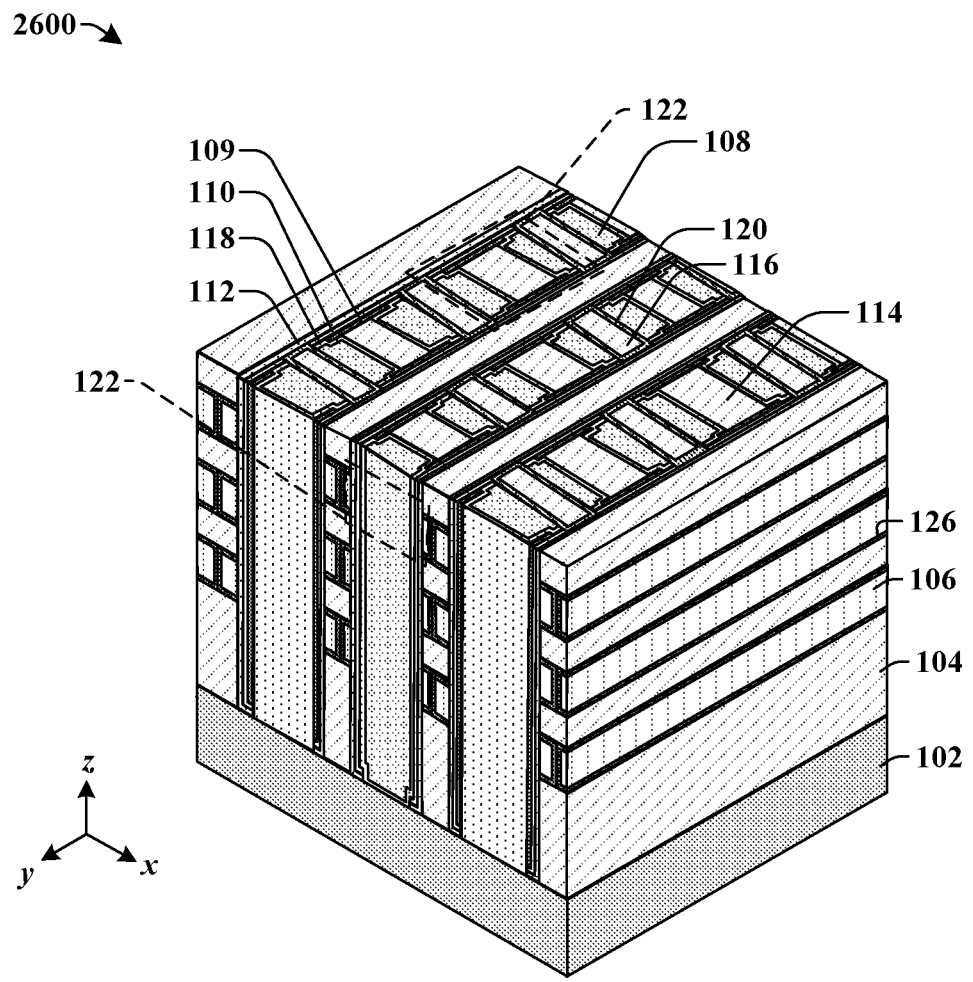

As shown in perspective view 2600 of FIG. 26, in some embodiments, a conductive material is formed to completely fill the sixth openings (2502 of FIG. 25) to form source/drain conductive lines 108 surrounded by the first and second protective liner layers 118, 120. In some embodiments, the source/drain conductive lines 108 comprise, for example, titanium nitride, tungsten, tantalum nitride, copper, or some other suitable conductive material. In some embodiments, the source/drain conductive lines 108 are formed by way of a deposition process (e.g., PVD, CVD, ALD, sputtering, etc.). In some embodiments, a planarization process (e.g., CMP) may also be performed to remove any excess conductive material of the source/drain conductive lines 108 arranged over topmost ones of the interconnect dielectric layers 104.

In some embodiments, the overall structure arranged over the substrate 102 is a 3D memory array comprising multiple memory cells 122 arranged in the x-, y-, and z-directions to increase device density over the substrate 102. In some embodiments, each memory cell 122 comprises two source/drain conductive lines 108 spaced apart from one another in the y-direction by one of the first barrier structures 114. Further, in some embodiments, each memory cell 122 is spaced apart from another memory cell in the y-direction by one of the second barrier structures 116. The first barrier structures 114 provide electrical isolation of features within the same memory cell 122, and the second barrier structures 116 provide electrical isolation between memory cells 122. Thus, because the first protective liner layers 118 and the second protective liner layers 120 respectively protected the first barrier structure 114 and the second barrier structure 116 from removal by the etchant(s) of FIG. 25, electrical isolation within and between memory cells is maintained, thereby improving reliability of the overall 3D memory array.

Figure 27:
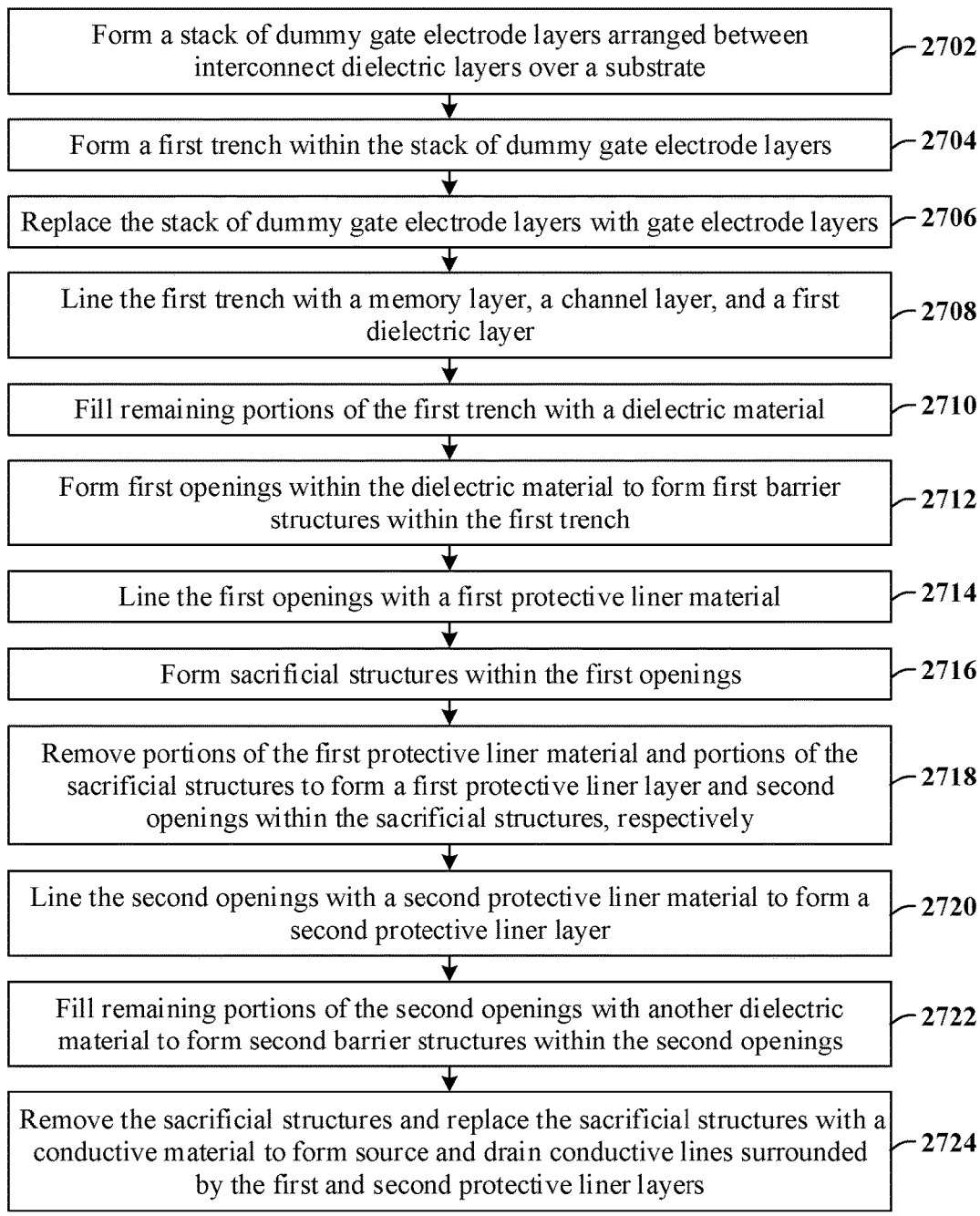
FIG. 27 illustrates a flow diagram of some embodiments corresponding to the method of FIGS. 6-26.

FIG. 27 illustrates a flow diagram of some embodiments of a method 2700 corresponding to the method illustrated in FIGS. 6-26.

While method 2700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2702, a stack of dummy gate electrode layers is formed between interconnect dielectric layers over a substrate. FIG. 6 illustrates perspective view 600 of some embodiments corresponding to act 2702.

At act 2704, a first trench is formed within the stack of dummy gate electrode layers. FIG. 7 illustrates perspective view 700 of some embodiments corresponding to act 2704.

At act 2706, the stack of dummy gate electrode layers is replaced with gate electrode layers. FIG. 14 illustrates perspective view 1400 of some embodiments corresponding to act 2706.

At act 2708, the first trench is lined with a memory layer, a channel layer, and a first dielectric layer. FIG. 15 illustrates perspective view 1500 of some embodiments corresponding to act 2708.

At act 2710, remaining portions of the first trench are filled with a dielectric material. FIG. 17 illustrates perspective view 1700 of some embodiments corresponding to act 2708.

At act 2712, first openings are formed within the dielectric material to form first barrier structures within the first trench. FIG. 18 illustrates perspective view 1800 of some embodiments corresponding to act 2712.

At act 2714, the first openings are lined with a first protective liner material. FIG. 21 illustrates perspective view 2100 of some embodiments corresponding to act 2714.

At act 2716, sacrificial structures are formed within the first openings. FIG. 22 illustrates perspective view 2200 of some embodiments corresponding to act 2716.

At act 2718, portions of the first protective liner material are removed to form a first protective liner layer, and portions of the sacrificial structures are removed to form second openings within the sacrificial structures. FIG. 23 illustrates perspective view 2300 of some embodiments corresponding to act 2718.

At act 2720, the second openings are lined with a second protective liner material to form a protective liner layer.

At act 2722, remaining portions of the second openings are filled with another dielectric material to form second barrier structures within the second openings. FIG. 24 illustrates perspective view of some embodiments corresponding to acts 2720 and 2722.

At act 2724, the sacrificial materials are removed and replaced with a conductive material to form source and drain conductive lines surrounded by the first and second protective liner layers. FIGS. 25 and 26 illustrate perspective views 2500 and 2600, respectively, of some embodiments corresponding to act 2724.

Therefore, the present disclosure relates to a method of forming a 3D NOR type memory array comprising a first protective liner layer around a first barrier structure and a second protective liner layer around a second barrier structure to protect the first and second barrier structures during future processing steps to improve reliability of the 3D NOR type memory array.

Accordingly, in some embodiments, the present disclosure relates to a memory device comprising: a stack of gate electrode layers arranged over a substrate; interconnect dielectric layers arranged above and below each gate electrode layer; a first memory cell arranged over the substrate and comprising: a first source/drain conductive line extending vertically through the stack of gate electrode layers; a second source/drain conductive line extending vertically through the stack of gate electrode layers; a channel layer arranged on outermost sidewalls of and extending between the first and second source/drain conductive lines; a memory layer arranged on outermost sidewalls of the channel layer; a first barrier structure arranged between a first side of the first source/drain conductive line and a first side of the second source/drain conductive line; a first protective liner layer arranged directly between the first side of the first source/drain conductive line and the first barrier structure and arranged directly between the first side of the second source/drain conductive line and the first barrier structure; a second barrier structure on a second side of the first source/drain conductive line; and a second protective liner layer arranged directly between the second barrier structure and the second side of the first source/drain conductive line.

In other embodiments, the present disclosure relates to a memory device comprising: a stack of gate electrode layers alternating with interconnect dielectric layers that are arranged over a substrate; a first source/drain conductive line and a second source/drain conductive line extending vertically through the stack of gate electrode layers; a channel layer and a memory layer extending between the first and second source/drain conductive lines; a first barrier structure extending vertically through the stack of gate electrode layers and arranged directly between the first and second source/drain conductive lines; a first protective liner layer arranged between the first barrier structure and the first source/drain conductive line, wherein the first protective liner layer is arranged on outer sidewalls and a lower surface of the first source/drain conductive line; and a second protective liner layer arranged on an upper surface of the first source/drain conductive line.

In yet other embodiments, the present disclosure relates to a method comprising: forming a stack of dummy gate electrode layers arranged between interconnect dielectric layers over a substrate; forming a first trench within the stack of dummy gate electrode layers; replacing the dummy gate electrode layer with gate electrode layers; forming a memory layer, a channel layer, and a first dielectric layer within the first trench; filling remaining portions of the first trench with a dielectric material; forming first openings within the dielectric material to form first barrier structures within the first trench; forming a first protective liner material within the first openings; forming sacrificial structures within the first openings; removing portions of the first protective liner material and portions of the sacrificial structures to respectively form a first protective liner layer and second openings within the sacrificial structures; forming a second protective liner layer within the second openings of the sacrificial structures; forming second barrier structures within remaining portions of the second openings; and removing the sacrificial structures and replacing the sacrificial structures with a conductive material to form source/drain conductive lines surrounded by the first and second protective liner layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
forming a stack of dummy gate electrode layers arranged between interconnect dielectric layers over a substrate;
forming a first trench within the stack of dummy gate electrode layers;

replacing the stack of dummy gate electrode layers with gate electrode layers;

forming a continuous memory layer, a continuous channel layer, and a continuous dielectric layer within the first trench;

filling remaining portions of the first trench with a fourth dielectric material;

forming fourth openings within the fourth dielectric material to form first barrier structures within the first trench;

forming a continuous protective liner layer within the fourth openings;

forming sacrificial structures within the fourth openings;

removing portions of the continuous protective liner layer and portions of the sacrificial structures to respectively form a first protective liner layer and fifth openings within the sacrificial structures, and leaving remaining portions of the sacrificial structures in place;

forming a second protective liner layer within the fifth openings of the sacrificial structures;

forming second barrier structures within remaining portions of the fifth openings; and removing the remaining portions of the sacrificial structures and replacing the remaining portions of the sacrificial structures with a conductive material to form source/drain conductive lines surrounded by the first protective liner layer and the second protective liner layer.

2. The method of claim 1, wherein the removing of the remaining portions of the sacrificial structures comprises one or more etchants, and wherein the first protective liner layer and the second protective liner layer each have a rate of removal by the one or more etchants that is slower than a rate of removal by the one or more etchants for each of the first barrier structures and the second barrier structures.

3. The method of claim 1, wherein the first protective liner layer comprises a material different than a material of the first barrier structures, and wherein the second protective liner layer comprises a material different than the material of the first barrier structures.

4. The method of claim 1, wherein the sacrificial structures comprise a material different than a material of each of the first barrier structures and the second barrier structures.

5. A method, comprising:
forming a first trench within a stack of dummy gate electrode layers;
forming a continuous memory layer, a continuous channel layer, and a fourth dielectric material within the first trench;
forming fourth openings within the fourth dielectric material;
forming sacrificial structures within the fourth openings;
removing portions of the sacrificial structures to respectively form fifth openings within the sacrificial structures, while leaving remaining portions of the sacrificial structures in place; and
removing the remaining portions of the sacrificial structures and replacing the remaining portions of the sacrificial structures with a conductive material to form source/drain conductive lines.

6. The method of claim 5, further comprising: forming a continuous protective liner layer within the fourth openings.

7. The method of claim 6, further comprising: removing portions of the continuous protective liner layer to form a first protective liner layer.

8. The method of claim 7, further comprising: forming a second protective liner layer within the fifth openings of the sacrificial structures.

9. The method of claim 8, wherein forming the fourth openings within the fourth dielectric material forms first barrier structures within the first trench; and further comprising:
forming second barrier structures within remaining portions of the fifth openings.

10. The method of claim 9, wherein the removing of the remaining portions of the sacrificial structures comprises one or more etchants, and wherein the first protective liner layer and the second protective liner layer each have a rate of removal by the one or more etchants that is slower than a rate of removal by the one or more etchants for each of the first barrier structures and the second barrier structures.

11. The method of claim 9, wherein the first protective liner layer comprises a material different than a material of the first barrier structures, and wherein the second protective liner layer comprises a material different than the material of the first barrier structures.

12. The method of claim 9, wherein the sacrificial structures comprise a material different than a material of each of the first barrier structures and the second barrier structures.

13. The method of claim 9, wherein the source/drain conductive lines are surrounded by the first protective liner layer and the second protective liner layer.

14. The method of claim 5, wherein the stack of dummy gate electrode layers are arranged between interconnect dielectric layers over a substrate.

15. A method, comprising:
forming a first trench within a stack of dummy gate electrode layers;
forming a continuous memory layer and a continuous channel layer in the first trench, and filling the first trench with a fourth dielectric material;
forming a fourth opening within the fourth dielectric material, and thereby forming at least one first barrier structures within the first trench;
forming a continuous protective liner layer within the fourth opening;
forming a sacrificial structure within the fourth opening;
removing a portion of the continuous protective liner layer and a portion of the sacrificial structure to respectively form a first protective liner layer and a fifth opening within the sacrificial structure, and leaving a remainder of the sacrificial structure in place;
forming a second protective liner layer within the fifth opening of the sacrificial structure;
forming a second barrier structures within a remaining portion of the fifth opening; and
replacing the remainder of the sacrificial structure with a conductive material to form a source/drain conductive line surrounded by the first protective liner layer and the second protective liner layer.

16. The method of claim 15, wherein the removing of the portion of the sacrificial structure comprises one or more etchants, and wherein the first protective liner layer and the second protective liner layer each have a rate of removal by the one or more etchants that is slower than a rate of removal by the one or more etchants for each of the at least one first barrier structures and the second barrier structure.

17. The method of claim 15, wherein the first protective liner layer comprises a material different than a material of the at least one first barrier structure, and wherein the second protective liner layer comprises a material different than the material of the at least one first barrier structure.

18. The method of claim 15, wherein the sacrificial structure comprises a material different than a material of each of the at least one first barrier structure and the second barrier structure.

19. The method of claim 15, wherein the at least one first barrier structure comprises a nitride, a carbide, an oxide, borosilicate glass (BSG), phosphoric silicate glass (PSG), borophosphosilicate glass (BPSG), or a low-k oxide.

20. The method of claim 19, wherein the first protective liner layer comprises a metal or a metal oxide.

* * * * *